United States Patent
Yang et al.

(10) Patent No.: US 9,869,019 B2
(45) Date of Patent: *Jan. 16, 2018

(54) SUBSTRATE PROCESSING APPARATUS INCLUDING PROCESSING UNIT

(71) Applicant: EUGENE TECHNOLOGY CO., LTD., Gyeonggi-do (KR)

(72) Inventors: Il-Kwang Yang, Gyeonggi-do (KR); Byoung-Gyu Song, Gyeonggi-do (KR); Yong-Ki Kim, Chungcheongnam-do (KR); Kyong-Hun Kim, Gyeonggi-do (KR); Yang-Sik Shin, Gyeonggi-do (KR)

(73) Assignee: EUGENE TECHNOLOGY CO., LTD., Yongin-si, Gyeonggi-do ( * ) Notice: Subject to any disclaimer, the term of this patent is extended or adjusted under 35 U.S.C. 154(b) by 226 days.

This patent is subject to a terminal disclaimer.

(21) Appl. No.: 14/361,323

(22) PCT Filed: Nov. 23, 2012

(86) PCT No.: PCT/KR2012/009951
§ 371 (c)(1),
(2) Date: May 29, 2014

(87) PCT Pub. No.: WO2013/103194
PCT Pub. Date: Jul. 11, 2013

(65) Prior Publication Data
US 2014/0345528 A1 Nov. 27, 2014

(30) Foreign Application Priority Data
Jan. 4, 2012 (KR) .......................... 10-2012-0001153

(51) Int. Cl.
C23C 16/452 (2006.01)
H01L 21/67 (2006.01)
H01L 21/677 (2006.01)
C23C 16/02 (2006.01)
C23C 16/44 (2006.01)
C23C 16/455 (2006.01)
C23C 16/505 (2006.01)
(Continued)

(52) U.S. Cl.
CPC ........ *C23C 16/452* (2013.01); *C23C 16/0245* (2013.01); *C23C 16/4412* (2013.01);
(Continued)

(58) Field of Classification Search
CPC ................................................ C23C 16/45546
See application file for complete search history.

(56) References Cited

U.S. PATENT DOCUMENTS 5,591,268 A * 1/1997 Usui ................... C23C 16/4412
                                                            118/719
6,352,593 B1 * 3/2002 Brors ...................... C23C 16/44
                                                            118/641
(Continued)

FOREIGN PATENT DOCUMENTS

KR 10-0431657 B1 5/2004
KR 10-0885597 B1 2/2009
(Continued)

*Primary Examiner* — Karla A Moore
(74) *Attorney, Agent, or Firm* — Rabin & Berdo, P.C.

(57) ABSTRACT

Provided is a substrate processing apparatus. The substrate processing apparatus in which a process with respect to substrates is performed includes a lower chamber having an opened upper portion, the lower chamber having a passage, through which the substrates are accessible, in a side thereof, an external reaction tube closing the opened upper portion of the lower chamber to provide a process space in which the process is performed, a substrate holder on which the one or more substrates are vertically stacked, the substrate holder being movable between a stacking position at which the substrates are stacked within the substrate holder and a process position at which the process with respect to the substrates is performed, a gas supply unit supplying a reaction gas into the process space, and a processing unit disposed outside the external reaction tube to activate the reaction gas, thereby performing the process with respect to the substrates.

13 Claims, 20 Drawing Sheets

(51) Int. Cl.
  *C23C 16/507* (2006.01)
  *C30B 25/02* (2006.01)
  *C30B 29/06* (2006.01)
  *C30B 35/00* (2006.01)
  *H01J 37/32* (2006.01)
  *H01L 21/673* (2006.01)
  *H01L 21/02* (2006.01)

(52) U.S. Cl.
  CPC ...... *C23C 16/45563* (2013.01); *C23C 16/505* (2013.01); *C23C 16/507* (2013.01); *C30B 25/02* (2013.01); *C30B 29/06* (2013.01); *C30B 35/00* (2013.01); *H01L 21/6719* (2013.01); *H01L 21/67126* (2013.01); *H01L 21/67757* (2013.01); *H01L 21/67772* (2013.01); *H01J 37/321* (2013.01); *H01J 37/3244* (2013.01); *H01L 21/0262* (2013.01); *H01L 21/02532* (2013.01); *H01L 21/67303* (2013.01)

(56) References Cited

U.S. PATENT DOCUMENTS

| | | | | |
|---|---|---|---|---|
| 6,444,262 | B1* | 9/2002 | Kitamura | C23C 16/4412 118/715 |
| 6,673,673 | B1* | 1/2004 | Yang | C23C 16/0272 257/E21.013 |
| 6,869,500 | B2 | 3/2005 | Lee et al. | |
| 7,371,998 | B2* | 5/2008 | Harris | F27B 17/0025 118/724 |
| 7,846,291 | B2 | 12/2010 | Otsuki | |
| 7,879,179 | B2 | 2/2011 | Otsuki | |
| 8,178,448 | B2 | 5/2012 | Nodera et al. | |
| 8,420,167 | B2* | 4/2013 | Nakashima | C23C 16/345 427/248.1 |
| 9,593,415 | B2* | 3/2017 | Yang | C23C 16/4412 |
| 9,620,395 | B2* | 4/2017 | Yang | H01L 21/67069 |
| 2001/0003271 | A1 | 6/2001 | Otsuki | |
| 2003/0060030 | A1 | 3/2003 | Lee et al. | |
| 2003/0200929 | A1 | 10/2003 | Otsuki | |
| 2005/0130451 | A1 | 6/2005 | Lee et al. | |
| 2008/0069966 | A1 | 3/2008 | Otsuki | |
| 2008/0070032 | A1 | 3/2008 | Otsuki | |
| 2008/0311760 | A1 | 12/2008 | Nodera et al. | |
| 2010/0304574 | A1 | 12/2010 | Nodera et al. | |

FOREIGN PATENT DOCUMENTS

| | | | |
|---|---|---|---|
| KR | 10-2009-0035430 A | 4/2009 | |
| KR | 10-1086588 B1 | 11/2011 | |
| WO | WO 2008/073926 A2 | 6/2008 | |
| WO | WO 2012047035 A2 * | 4/2012 | ......... C23C 16/4412 |

* cited by examiner

SUBSTRATE PROCESSING APPARATUS INCLUDING PROCESSING UNIT

BACKGROUND OF THE INVENTION

The present invention disclosed herein relates to an apparatus for processing a substrate, and more particularly, to a substrate processing apparatus including a processing unit, which activates the reaction gas.

Ordinary selective epitaxy processes involve deposition reaction and etching reaction. The deposition and etching reactions may occur simultaneously at slightly different reaction rates with respect to a polycrystalline layer and an epitaxial layer. While an existing polycrystalline layer and/or amorphous layer are/is deposited on at least one second layer during the deposition process, the epitaxial layer is formed on a surface of a single crystal. However, the deposited polycrystalline layer is etched faster than the epitaxial layer. Thus, corrosive gas may be changed in concentration to perform a net selective process, thereby realizing the deposition of an epitaxial material and the deposition of a limited or unlimited polycrystalline material. For example, a selective epitaxy process may be performed to form an epitaxial layer formed of a material containing silicon on a surface of single crystal silicon without leaving the deposits on a spacer.

Generally, the selective epitaxy process has several limitations. To maintain selectivity during the selective epitaxy process, a chemical concentration and reaction temperature of a precursor should be adjusted and controlled over the deposition process. If an insufficient silicon precursor is supplied, the etching reaction is activated to decrease the whole process rate. Also, features of the substrate may be deteriorated with respect to the etching. If an insufficient corrosive solution precursor is supplied, selectivity for forming the single crystalline and polycrystalline materials over the surface of the substrate may be reduced in the deposition reaction. Also, typical selective epitaxy processes are performed at a high reaction temperature of about 800° C., about 1,000° C., or more. Here, the high temperature is unsuited for the manufacturing process due to uncontrolled nitridation reaction and thermal budge on the surface of the substrate.

PRIOR ART DOCUMENTS

Patent Documents

International Publication Application No. WO 2008/073926 (2008. Jun. 19)
Korean Patent Publication Application No. 10-2009-0035430 (2009. Apr. 9)

SUMMARY OF THE INVENTION

The present invention provides a substrate processing apparatus which activates a reaction gas to perform a process on a substrate.

Further another object of the present invention will become evident with reference to following detailed descriptions and accompanying drawings.

Embodiments of the present invention provide substrate processing apparatuses in which a process with respect to substrates is performed, the substrate processing apparatuses including: a lower chamber having an opened upper portion, the lower chamber having a passage, through which the substrates are accessible, in a side thereof; an external reaction tube closing the opened upper portion of the lower chamber to provide a process space in which the process is performed; a substrate holder on which the one or more substrates are vertically stacked, the substrate holder being movable between a stacking position at which the substrates are stacked within the substrate holder and a process position at which the process with respect to the substrates is performed; a gas supply unit supplying a reaction gas into the process space; and a processing unit disposed outside the external reaction tube to activate the reaction gas, thereby performing the process with respect to the substrates.

In some embodiments, the processing unit may include: a heater disposed on one of a side portion and an upper portion of the external reaction tube, the heater heating the process space to perform an epitaxial deposition process on the substrates; and a plasma generation member disposed on one of the side portion and the upper portion of the external reaction tube, the plasma generation member generating plasma to perform a cleaning process on the substrates.

In other embodiments, the processing unit may include a heater disposed outside the external reaction tube, the heater heating the process space to perform an epitaxial deposition process on the substrates.

In still other embodiments, the processing unit may include a plasma generation member disposed outside the external reaction tube, the plasma generation member generating plasma to perform a cleaning process on the substrates.

In even other embodiments, the plasma generation member may include an ICP antenna.

In yet other embodiments, the substrate processing apparatuses may further include an internal reaction tube disposed within the external reaction tube, the internal reaction tube being disposed around the substrate holder at the process position to divide a reaction region with respect to the substrates.

In further embodiments, the substrate processing apparatuses may further include a heat blocking plate disposed under the substrate holder to close an opened lower portion of the internal reaction tube when the substrate holder is disposed at the process position.

In still further embodiments, the substrate processing apparatuses may further include: a cover in which the processing unit is mounted, the cover being disposed around the external reaction tube to surround the side and upper portions of the external reaction tube; and a cover moving unit for moving the cover to the process position at which the cover surrounds the external reaction tube and a release position at which the cover is separated from the external reaction tube.

In even further embodiments, the cover moving unit may include: an elevation rod disposed on a side of the cover in a state where the elevation rod stands up, the elevation rod having a screw thread on an outer surface thereof; a support frame connected to the cover, the support frame being moved along the elevation rod through rotation of the elevation rod; and a driving motor driving the elevation rod.

In yet further embodiments, the gas supply unit may be disposed within the external reaction tube to form a flow of the reaction gas having different phase differences according to a vertical direction.

In much further embodiments, the gas supply unit may include: a plurality of supply nozzles disposed along an inner wall of the external reaction tube, the plurality of supply nozzles being disposed at heights different from each other to discharge the reaction gas; a plurality of supply tubes respectively connected to the plurality of supply nozzles to supply the reaction gas into each of the supply nozzles; a plurality of exhaust nozzles disposed along the inner wall of the external reaction tube, the plurality of exhaust nozzles being disposed at heights different from each other to suction non-reaction gases and byproducts within the process space; and a plurality of exhaust tubes respectively connected to the plurality of exhaust nozzles to allow the non-reaction gases and the byproducts suctioned through each of the exhaust nozzles to pass therethrough.

In still much further embodiments, the substrate processing apparatuses may further include a rear exhaust line connected to the exhaust nozzles to discharge the non-reaction gases and the byproducts suctioned through the exhaust nozzles, wherein the lower chamber may include an exhaust port connecting the exhaust nozzles to the rear exhaust line and an auxiliary exhaust port connecting a stacking space defined within the lower chamber to the rear exhaust line.

In even much further embodiments, the stacking space may have a pressure greater than that of the process space.

In yet much further embodiments, the lower chamber may include an auxiliary gas supply port connected to a stacking space defined within the lower chamber.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
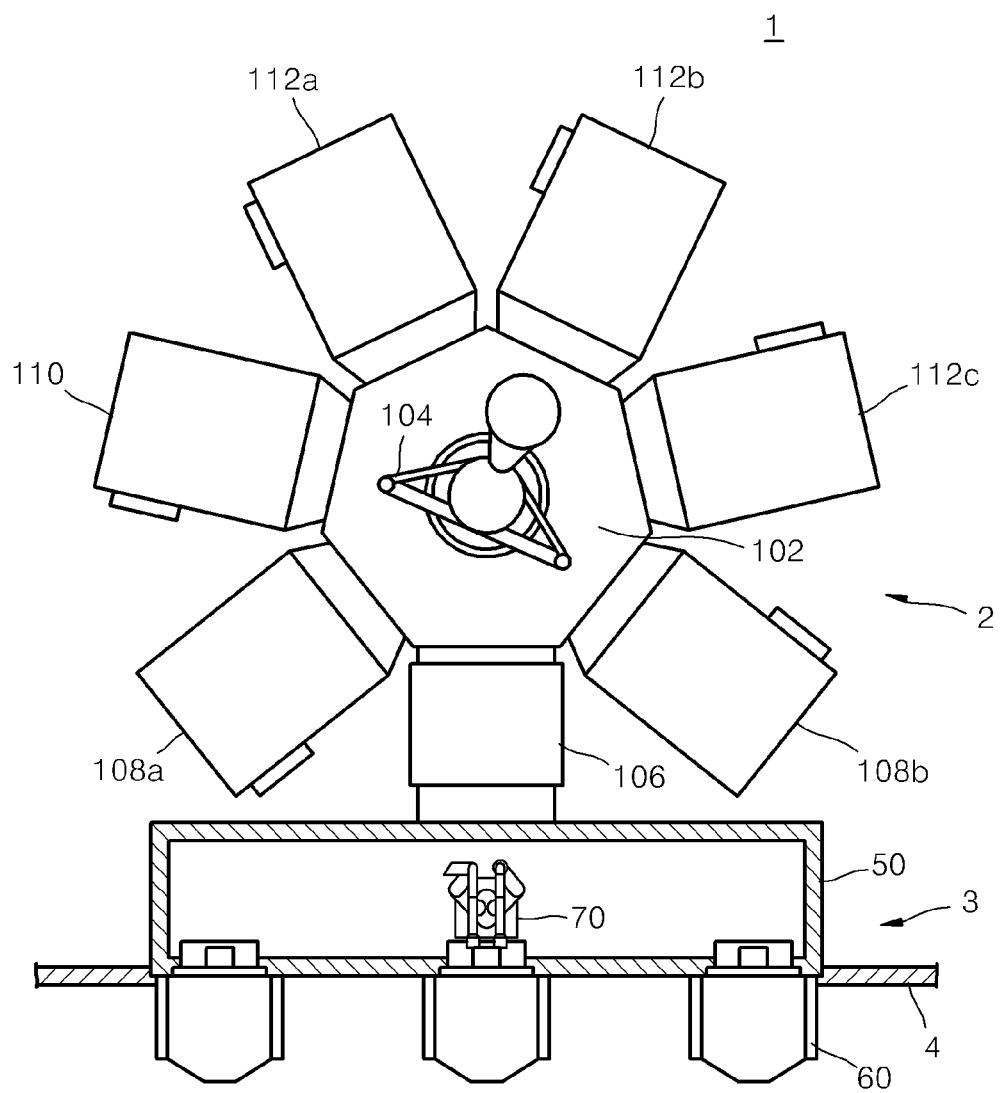
FIG. 1 is a schematic view of semiconductor manufacturing equipment according to an embodiment of the present invention.

Hereinafter, exemplary embodiments of the present invention will be described in detail with reference to FIGS. 1 to 28. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the drawings, the shapes of components are exaggerated for clarity of illustration.

FIG. is a schematic view of semiconductor manufacturing equipment 1 according to an embodiment of the present invention. The semiconductor manufacturing equipment 1 includes process equipment 2, an equipment front end module (EFEM) 3, and an interface wall 4. The EFEM 3 is mounted on a front side of the process equipment 2 to transfer a wafer W between a container (not shown) in which substrates S are received and the process equipment 2.

The EFEM 3 includes a plurality of loadports 60 and a frame 50. The frame 50 is disposed between the loadports 60 and the process equipment 2. The container in which the substrates S are received is placed on the loadports 60 by a transfer unit (not shown) such as an overhead transfer, an overhead conveyor, or an automatic guided vehicle.

An airtight container such as a front open unified pod (FOUP) may be used as the container. A frame robot 70 for transferring the substrates S between the container placed on the loadports 60 and the process equipment 2 is disposed within the frame 50. A door opener (not shown) for automatically opening or closing a door of the container may be disposed within the frame 50. Also, a fan filter unit (FFU) (not shown) for supplying clean air into the frame 50 may be provided within the frame 50 so that the clean air flows downward from an upper side within the frame 50.

A predetermined process with respect to each of the substrates S is performed within the process equipment 2. The process equipment 2 includes a transfer chamber 102, a loadlock chamber 106, cleaning chambers 108a and 108b, a buffer chamber 110, and epitaxial chambers (or epitaxial apparatuses) 112a, 112b, and 112c. The transfer chamber 102 may have a substantially polygonal shape when viewed from an upper side. The loadlock chamber 106, the cleaning chambers 108a and 108b, the buffer chamber 110, and the epitaxial chambers 112a, 112b, and 112c are disposed on side surfaces of the transfer chamber 102.

The loadlock chamber 106 is disposed on a side surface adjacent to the EFEM 3 among the side surfaces of the transfer chamber 102. The substrate S is loaded to the process equipment 2 after the substrate S is temporarily stayed within the loadlock chamber 106 so as to perform the process. After the process is completed, the substrate S is unloaded from the process equipment 2 and then is temporarily stayed within the loadlock chamber 106. The transfer chamber 102, the cleaning chambers 108a and 108b, the buffer chamber 110, and the epitaxial chambers 112a, 112b, and 112c are maintained in a vacuum state. The loadlock chamber 106 is switched into a vacuum or atmospheric state. The loadlock chamber 106 prevents external contaminants from being introduced into the transfer chamber 102, the cleaning chambers 108a and 108b, the buffer chamber 110, and the epitaxial chambers 112a, 112b, and 112c. Also, since the substrate S is not exposed to the atmosphere during the transfer of the substrate S, it may prevent an oxide from being grown on the substrate S.

Gate valves (not shown) are disposed between the loadlock chamber 106 and the transfer chamber 102 and between the loadlock chamber 106 and the EFEM 3. When the substrate S is transferred between the EFEM 3 and the loadlock chamber 106, the gate valve disposed between the loadlock chamber 106 and the transfer chamber 102 is closed. Also, when the substrate S is transferred between the loadlock chamber 106 and the transfer chamber 102, the gate valve disposed between the loadlock chamber 106 and the EFEM 3 is closed.

A substrate handler 104 is disposed in the transfer chamber 102. The substrate handler 104 transfers the substrate S between the loadlock chamber 106, the cleaning chamber 108a and 108b, the buffer chamber 110, and the epitaxial chambers 112a, 112b, and 112c. The transfer chamber 102 is sealed so that the transfer chamber 102 is maintained in the vacuum state when the substrate S is transferred. The maintenance of the vacuum state is for preventing the substrate S from being exposed to contaminants (e.g., $O_2$, particle materials, and the like).

The epitaxial chambers 112a, 112b, and 112c are provided to form an epitaxial layer on the substrate S. In the current embodiment, the three epitaxial chambers 112a, 112b, and 112c are provided. Since it takes a relatively long time to perform an epitaxial process when compared to that of a cleaning process, manufacturing yield may be improved through the plurality of epitaxial chambers. Unlike the current embodiment, four or more epitaxial chambers or two or less epitaxial chambers may be provided.

The cleaning chambers 108a and 108b are configured to clean the substrate S before the epitaxial process is performed on the substrate S within the epitaxial chambers 112a, 112b, and 112c. To successfully perform the epitaxial process, an amount of oxide remaining on the crystalline substrate should be minimized. If an oxygen content on a surface of the substrate S is too high, oxygen atoms may interrupt crystallographic disposition of materials to be deposited on a seed substrate, and thus, it may have a bad influence on the epitaxial process. For example, during the silicon epitaxial deposition, excessive oxygen on the crystalline substrate may displace silicon atoms from its epitaxial position by oxygen atom clusters in atom units. The local atom displacement may cause errors in follow-up atom arrangement when a layer is more thickly grown. This phenomenon may be so-called stacking faults or hillock defects. Oxygenation on a surface of a substrate may, for example, occur when the substrate is exposed to the atmosphere while the substrate is transferred. Thus, the cleaning process for removing a native oxide (or a surface oxide) formed on the substrate S may be performed within the cleaning chambers 108a and 108b.

The cleaning process may be a dry etching process using a radical state hydrogen (H*) and a $NF_3$ gas. For example, when the silicon oxide formed on a surface of a substrate is etched, the substrate is disposed within a chamber, and then, the chamber has a vacuum atmosphere therein to generate an intermediate product reacting with the silicon oxide within the chamber.

For example, when reaction gases such as a hydrogen radical gas (H*) and a fluoride gas (for example, nitrogen fluoride ($NF_3$)) are supplied into the chamber, the reaction gases are reduced as expressed in the following reaction formula (1) to generate an intermediate product such as $NH_xF_y$ (where x and y are certain integers).

$$H^* + NF_3 \Rightarrow NH_xF_y \quad (1)$$

Since the intermediate product has high reactivity with silicon oxide ($SiO_2$), when the intermediate product reaches a surface of the silicon substrate, the intermediate product selectively reacts with the silicon oxide to generate a reaction product (($NH_4)_2SiF_6$) as expressed in following reaction formula (2).

$$NH_xF_y + SiO_2 \Rightarrow (NH_4)_2SiF_6 + H_2O \quad (2)$$
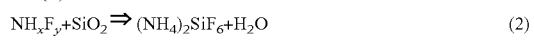

Thereafter, when the silicon substrate is heated at a temperature of about 100° C. or more, the reaction product is pyrolyzed as expressed in following reaction formula (3) to form a pyrolyzed gas, and then, the pyrolyzed gas is evaporated. As a result, the silicon oxide may be removed from the surface of the substrate. As shown in the following reaction formula (3), the pyrolysis gas includes a gas containing fluorine such as an HF gas or a $SiF_4$ gas.

$$(NH_4)_2SiF_6 \Rightarrow NH_3 + HF + SiF_4 \quad (3)$$

As described above, the cleaning process may include a reaction process for generating the reaction product and a heating process for pyrolyzing the reaction product. The reaction process and the heating process may be performed at the same time within the cleaning chambers 108a and 108b. Alternatively, the reaction process may be performed within one of the cleaning chambers 108a and 108b, and the heating process may be performed within the other one of the cleaning chambers 108a and 108b.

The buffer chamber 110 provides a space in which substrates S, on which the cleaning process is completed, are stacked and a space in which substrate S, on which the epitaxial process is performed, are stacked. When the cleaning process is completed, the substrate S is transferred into the buffer chamber 110 and then stacked within the buffer chamber 110 before the substrate S is transferred into the epitaxial chambers 112a, 112b, and 112c. The epitaxial chambers 112a, 112b, and 112c may be batch type chambers in which a single process is performed on a plurality of substrates. When the epitaxial process is completed within the epitaxial chambers 112a, 112b, and 112c, substrates S on which the epitaxial process is performed are successively stacked within the buffer chamber 110. Also, substrates S on which the cleaning process is completed are successively stacked within the epitaxial chambers 112a, 112b, and 112c. Here, the substrates S may be vertically stacked within the buffer chamber 110.

Figure 2:
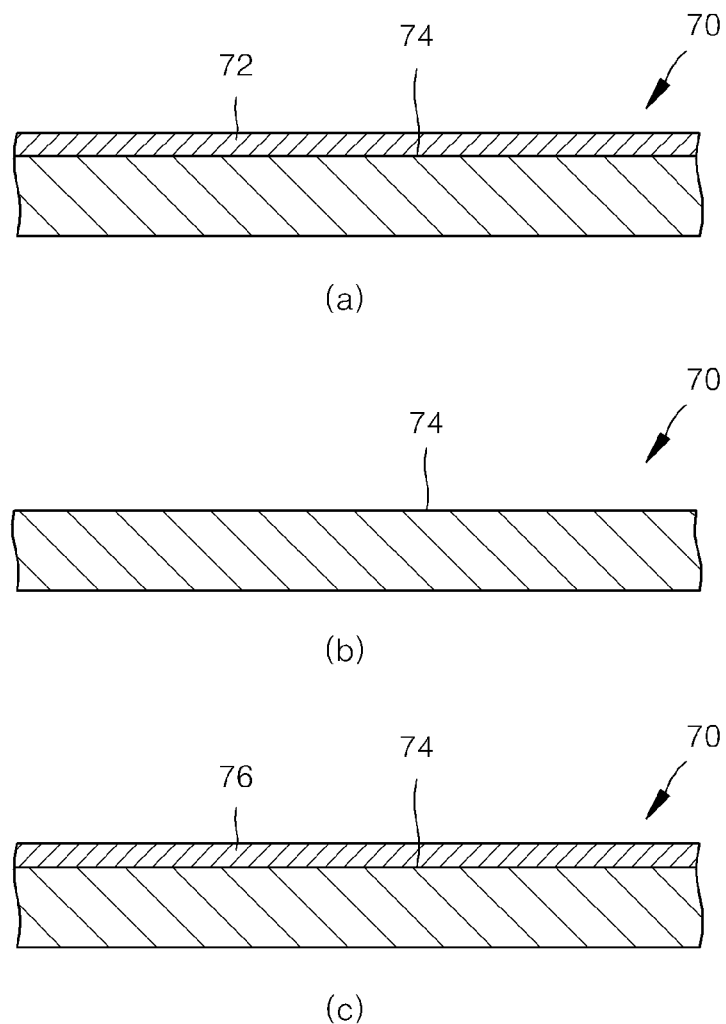
FIG. 2 is a view of a substrate processed according to an embodiment of the present invention.

FIG. 2 is a view of a substrate processed according to an embodiment of the present invention. As described above, the cleaning process is performed on the substrate S within the cleaning chambers 108a and 108b before the epitaxial process is performed on the substrate S. Thus, an oxide 72 formed on a surface of a substrate 70 may be removed through the cleaning process. The oxide may be removed through the cleaning process within the cleaning chamber 108a and 108b. Also, an epitaxy surface 74 formed on the surface of the substrate 70 may be exposed through the cleaning process to assist the growth of an epitaxial layer.

Thereafter, an epitaxial process is performed on the substrate 70 within the epitaxial chambers 112a, 112b, and 112c. The epitaxial process may be performed by chemical vapor deposition. The epitaxial process may be performed to form an epitaxy layer 76 on the epitaxy surface 74. The epitaxy surface 74 formed on the substrate 70 may be exposed by reaction gases including a silicon gas (e.g., $SiCl_4$, $SiHCl_3$, $SiH_2Cl_2$, $SiH_3Cl$, $Si_2H_6$, or $SiH_4$) and a carrier gas (e.g., $N_2$ and/or $H_2$). Also, when the epitaxy layer 76 is required to include a dopant, a silicon-containing gas may include a dopant-containing gas (e.g., $AsH_3$, $PH_3$, and/or $B_2H_6$).

Figure 3:
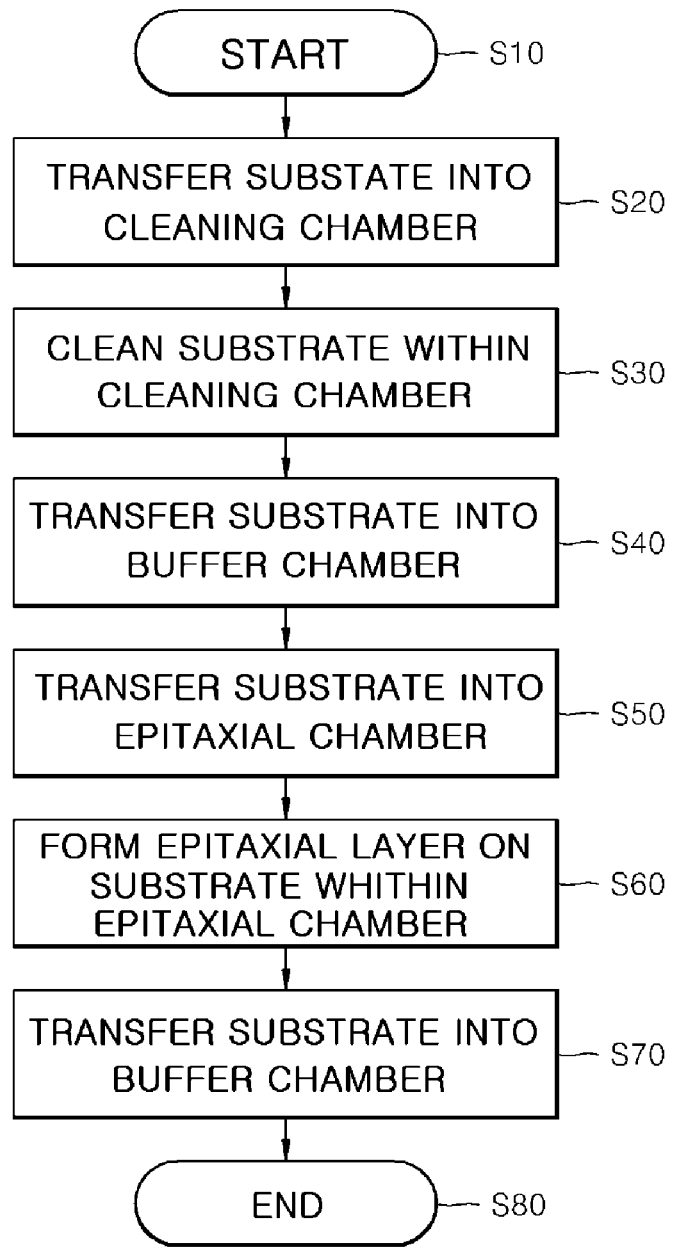
FIG. 3 is a flowchart illustrating a process for forming an epitaxial layer according to an embodiment of the present invention.

FIG. 3 is a flowchart illustrating a process for forming an epitaxial layer according to an embodiment of the present invention. In operation S10, a process for forming an epitaxial layer starts. In operation S20, a substrate S is transferred into cleaning chambers 108a and 108b before an epitaxial process is performed on the substrate S. Here, a substrate handler 104 transfers the substrate S into the cleaning chambers 108a and 108b. The substrate S is transferred through a transfer chamber 102 in which a vacuum state is maintained. In operation S30, a cleaning process is performed on the substrate S. As described above, the cleaning process includes a reaction process for generating a reaction product and a heating process for pyrolyzing the reaction product. The reaction process and the heating process may be performed at the same time within the cleaning chambers 108a and 108b. Alternatively, the reaction process may be performed within one of the cleaning chambers 108a and 108b, and the heating process may be performed within the other one of the cleaning chambers 108a and 108b.

In operation S40, the substrate S on which the cleaning process is completed is transferred into a buffer chamber 110 and is stacked within the buffer chamber 110. Then, the substrate S is on standby within the buffer chamber 110 so as to perform the epitaxial process. In operation S50, the substrate S is transferred into epitaxial chambers 112a, 112b, and 112c. The transfer of the substrate S is performed through the transfer chamber 102 in which the vacuum state is maintained. In operation S60, an epitaxial layer may be formed on the substrate S. In operation S70, the substrate S is transferred again into the buffer chamber 110 and is stacked within the buffer chamber 110. Thereafter, in operation S80, the process for forming the epitaxial layer is ended.

Figure 4:
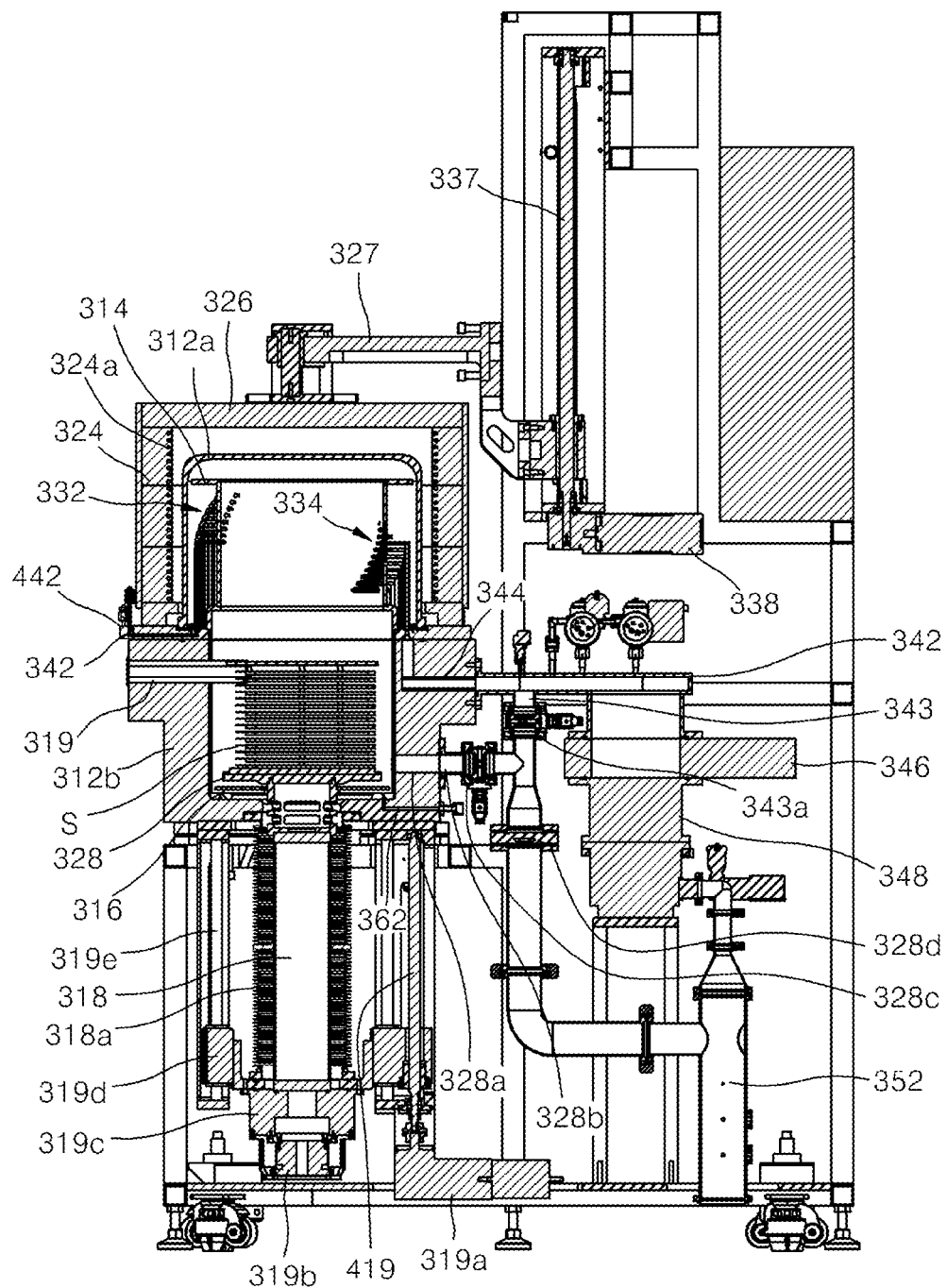
FIG. 4 is a schematic view illustrating an epitaxial apparatus of FIG. 1.
Figure 5:
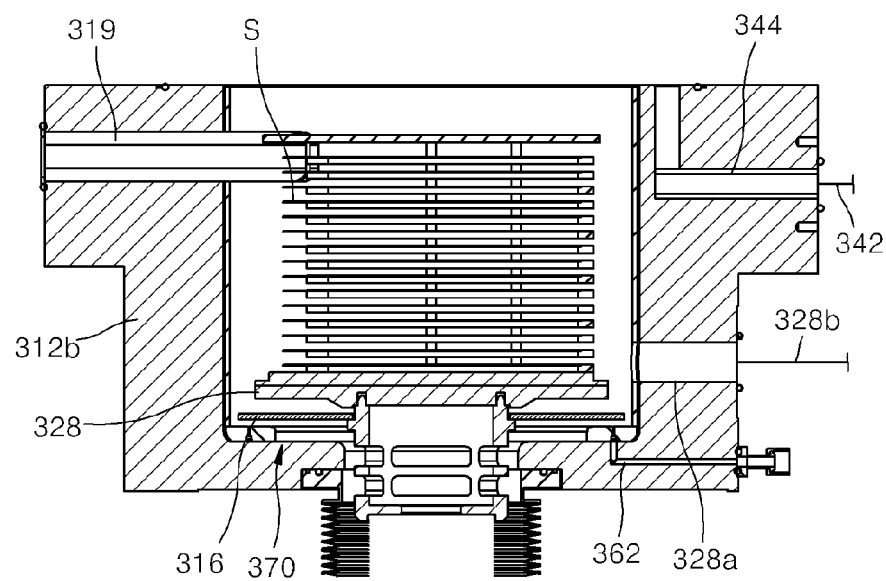
FIG. 5 is a cross-sectional view illustrating a lower chamber and a substrate holder of FIG. 1.

FIG. 4 is a schematic view illustrating an epitaxial apparatus of FIG. 1. FIG. 5 is a cross-sectional view illustrating a lower chamber and a substrate holder of FIG. 1. An epitaxial apparatus (or an epitaxial chamber) includes a lower chamber 312b having an opened upper side. The lower chamber 312b is connected to a transfer chamber 102. The lower chamber 312b has a passage 319 connected to the transfer chamber 102. A substrate S may be loaded from the transfer chamber 102 into the lower chamber through the passage 319. A gate valve (not shown) may be disposed outside the passage 319. The passage 319 may be opened or closed by the gate valve.

The epitaxial apparatus includes a substrate holder 328 on which a plurality of substrates S are stacked. The substrates S are vertically stacked on the substrate holder 328. For example, fifteen substrates S may be stacked on the substrate holder 328. As shown in FIG. 5, while the substrate holder 328 is disposed in a stacking space (or at a "stacking position) provided within the lower chamber 312b, the substrates S may be stacked within the substrate holder 328. As described below, the substrate holder 328 may be elevated. When the substrates S are stacked on a slot of the substrate holder 328, the substrate holder 328 may be elevated so that substrates S are stacked on the next slot of the substrate holder 328. When all the substrates are stacked on the substrate holder 328, the substrate holder 328 is moved into an external reaction tube 312a (or to a "process position"), and an epitaxial process is performed within the external reaction tube 312a.

Figure 11:
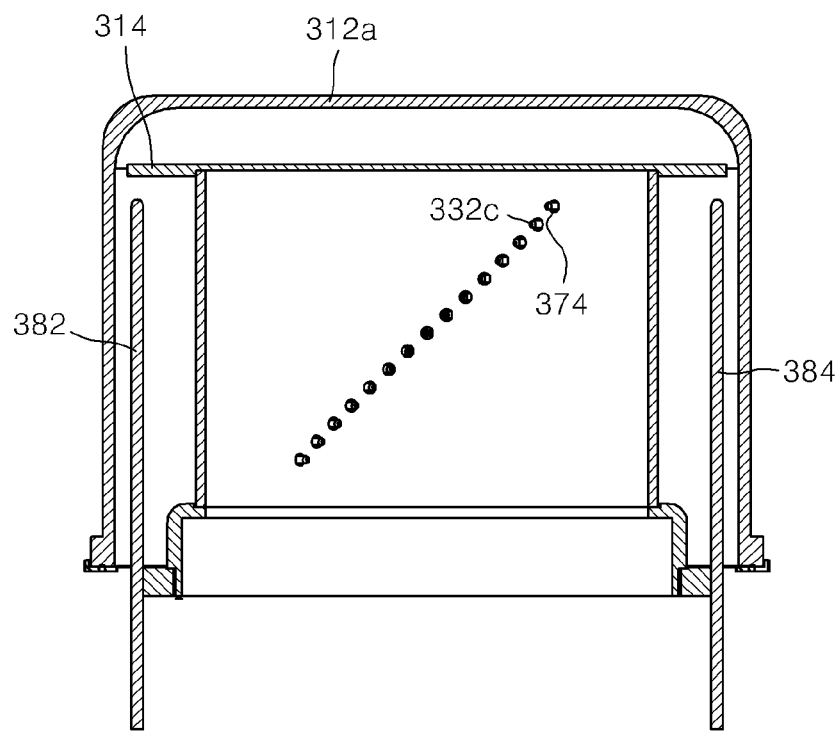
FIG. 11 is a cross-sectional view illustrating arrangements of the supply nozzles and thermocouples of FIG. 1.

A heat blocking plate 316 is disposed under the substrate holder 328 and elevated together with the substrate holder 328. When the substrate holder 328 is moved to the process position, as shown in FIG. 11, the heat blocking plate 316 closes an opened lower portion of the internal reaction tube 314. The heat blocking plate 316 may be formed of one of ceramic, quartz, a metal material coated with ceramic, AlN, Ni, and Inconel. The heat blocking plate 316 prevents heat within a reaction region from being transmitted into the stacking space when processes are performed. A portion of a reaction gas supplied into the reaction region may be moved into the stacking space through the opened lower side of the internal reaction tube 314. Here, when the stacking space has a temperature greater than a predetermined temperature, a portion of the reaction gas may be deposited on an inner wall of the stacking space. Thus, it may be necessary to prevent the stacking space from being heated due to the heat blocking plate 316. Therefore, it may prevent the reaction gas from being deposited on the inner wall of the stacking space.

Also, to perform a normal epitaxial process in the reaction region of the internal reaction tube 314, external obstruction factors should be removed. However, as described above, since the internal reaction tube 314 has the opened lower portion, heat within the reaction region may be lost through the lower side of the internal reaction tube 314. Here, the heat loss may be fatal to the epitaxial process. The heat blocking plate 316 closes the opened lower portion of the internal reaction tube 314 to block heat and prevent heat from being lost.

A lower chamber 312b includes an exhaust port 344, an auxiliary exhaust port 328a, and an auxiliary gas supply port 362. The exhaust port 344 has a "L" shape. Exhaust nozzles 334b that will be described later are connected to a first exhaust line 342 through the exhaust port 344. The auxiliary exhaust port 328a is connected to the auxiliary exhaust line 328b. A gas within the stacking space of the lower chamber 312b may be exhausted the auxiliary exhaust port 328a.

The auxiliary gas supply port 362 is connected to an auxiliary gas supply line (not shown) to supply a gas supplied through the auxiliary gas supply line into the stacking space. For example, an inert gas may be supplied into the stacking space through the auxiliary gas supply port 362. As the inert gas is supplied into the stacking space, it may prevent the reaction gas supplied into the process space from being introduced into the stacking space.

Furthermore, since the inert gas is continuously supplied into the stacking space and exhausted through the auxiliary exhaust port 328a, it may prevent the reaction gas supplied into the process space from being moved into the stacking space. Here, the stacking space may be set so that an internal pressure thereof is slightly greater than that of the process space. When the stacking pace has a pressure slightly greater than that of the process space, the reaction gas within the process space is not moved into the stacking space.

Figure 6:
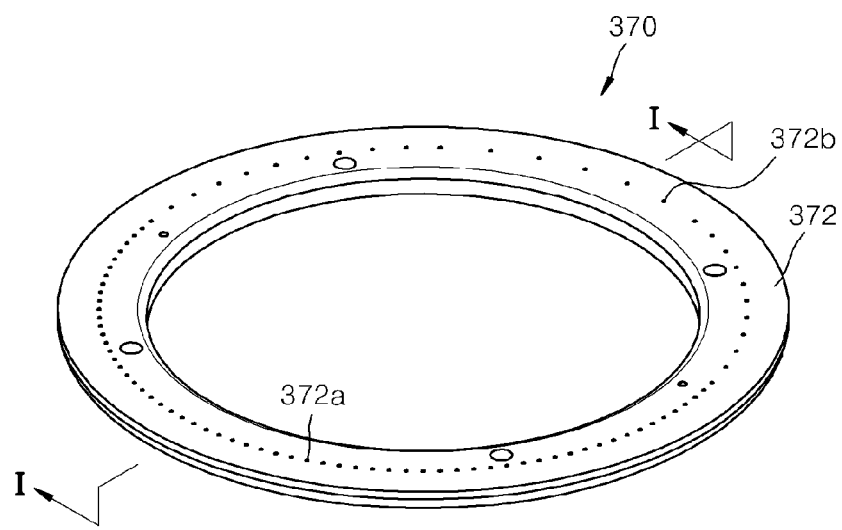
FIG. 6 is a schematic perspective view illustrating a diffusion plate of FIG. 5.
Figure 7:
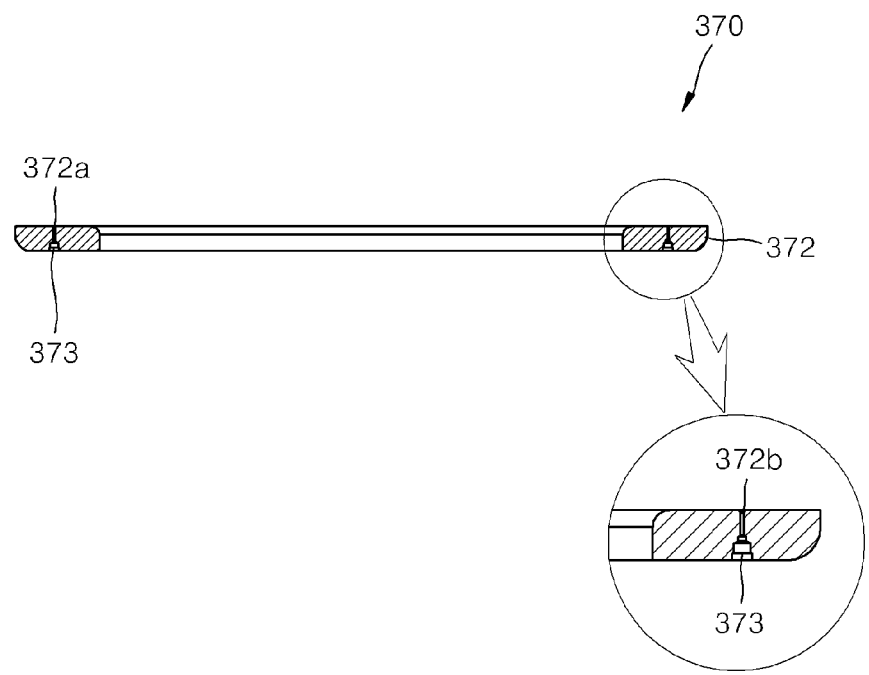
FIG. 7 is a cross-sectional view of the diffusion plate of FIG. 6, taken along line I-I.
Figure 8:
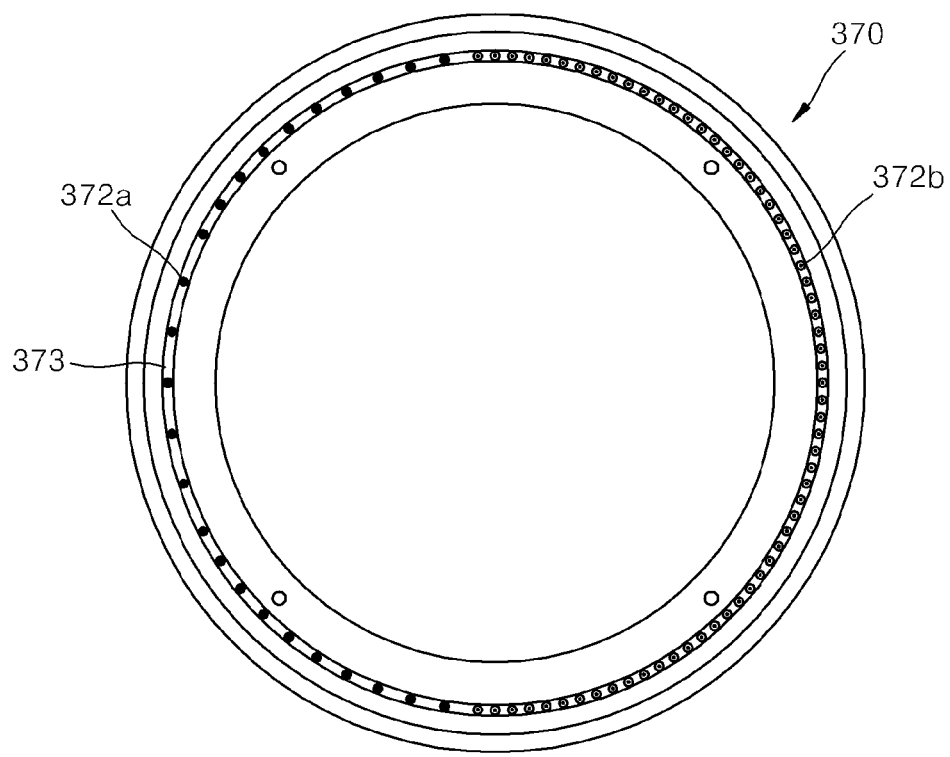
FIG. 8 is a rear view illustrating the diffusion plate of FIG. 6.

FIG. 6 is a schematic perspective view illustrating a diffusion plate of FIG. 5. FIG. 7 is a cross-sectional view of the diffusion plate of FIG. 6, taken along line I-I. FIG. 8 is a rear view illustrating the diffusion plate of FIG. 6. Referring to FIGS. 6 to 8, a diffusion plate 370 is disposed on a bottom surface of the lower chamber 312b. Also, the diffusion plate 370 is disposed on a discharge hole of the auxiliary gas supply port 362 to diffuse a gas discharged through the auxiliary gas supply port 362.

The diffusion plate 370 is disposed around the rotation shaft 318 and has a ring shape. The diffusion plate 370 includes a main body 372 and first and second diffusion holes 372a and 372b defined in the main body 372. The first and second diffusion holes 372a and 372b are defined along a circumference of the diffusion plate 370 (or the rotation shaft 318)). As shown in FIG. 7, the first and second diffusion holes 372a and 372b are connected to a buffer space 373 defined under the first and second diffusion holes 372a and 372b.

As shown in FIG. 8, the buffer space 373 has a ring shape corresponding to that of the main body 372 and is connected to the auxiliary gas supply port 362. Thus, the gas discharged through the auxiliary gas supply port 362 is diffused into the buffer space 373. Then, the gas is diffused into the stacking space through the first and second diffusion holes 372a and 372b.

The gas diffused through the diffusion plate 370 is not uniformly distributed within the stacking space. For example, the more the gas approaches the auxiliary gas supply port 362, the gas is increased in density. Also, the more the gas is away from the auxiliary gas supply port 362, the more the gas is decreased in density. That is, the gas is changed in density according to positions of the auxiliary gas supply port 362. To prevent this from occurring, it may be necessary to adjust a spaced distance (or density) between the first and second diffusion holes 372a and 372b.

As shown in FIG. 6, the first diffusion holes 372a are disposed further away from the auxiliary gas supply port 362 than the second diffusion holes 372b. Also, a spaced distance between the first diffusion holes 372a is less than that between the second diffusion holes 372b. Thus, the first diffusion holes 372a may have relatively high density on the same area. Thus, the gas distribution within the stacking space may be adjusted.

Figure 9:
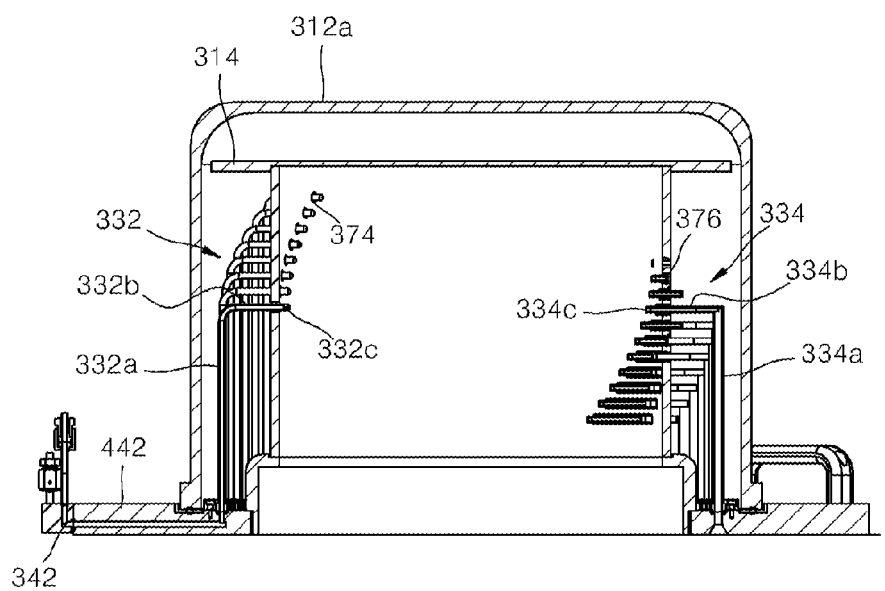
FIG. 9 is a schematic cross-sectional view illustrating an external reaction tube, an internal reaction tube, supply nozzles, and exhaust nozzles of FIG. 1.

FIG. 9 is a schematic cross-sectional view illustrating an external reaction tube, an internal reaction tube, supply nozzles, and exhaust nozzles of FIG. 1. The external reaction tube 312a closes an opened upper side of the lower chamber 312b to provide the process space in which the epitaxial process is performed. A support flange 442 is disposed between the lower chamber 312b and the external reaction tube 312a. The external reaction tube 312 is disposed on the support flange 442. The stacking space of the lower chamber 312b communicates with the process space of the external reaction tube 312a through an opening defined in a center of the support flange 442. As described above, when all the substrates are stacked on the substrate holder 328, the substrate holder 328 may be moved into the process space of the external reaction tube 312a.

The internal reaction tube 314 is disposed inside the external reaction tube 312a to provide a reaction region with respect to a substrate S. The inside of the external reaction tube 312a is divided into a reaction region and a non-reaction region by the internal reaction tube 314. The reaction region is defined inside the internal reaction tube 314, and the non-reaction region is defined outside the internal reaction tube 314. When the substrate holder 328 is moved to the process position, the substrate holder 328 is disposed in the reaction region. The reaction region has a volume less than that of the process space. Thus, when the reaction gas is supplied into the reaction region, a usage amount of the reaction gas may be minimized. Also, the reaction gas may be concentrated onto the substrates S stacked within the substrate holder 328. The internal reaction tube 314 has a closed upper side and an opened lower side. Thus, the substrate holder 328 is moved into the reaction region through the lower side of the internal reaction tube 314.

As shown in FIG. 4, a side cover 324 and an upper cover 326 are disposed to surround the external reaction tube 312a ("process position"), and a side heater 324a is disposed within the side cover 324. The side heater 324a heats the process space within the external reaction tube 312a. Thus, the process space (or the reaction region) may reach a temperature (a process temperature) enough to perform the epitaxial process.

Figure 10:
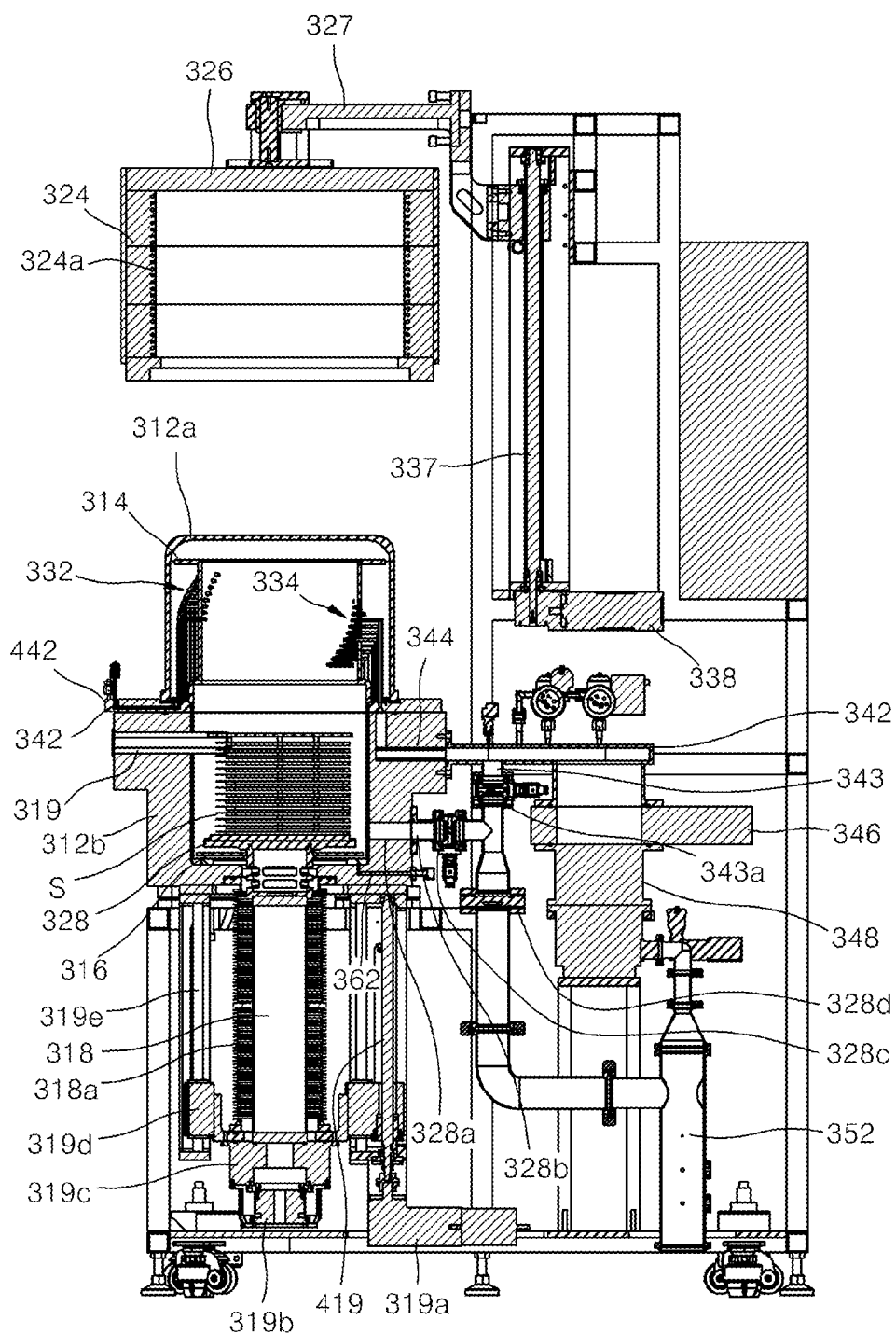
FIG. 10 is a view illustrating a state in which a side heater and an upper heater of FIG. 1 are removed.

The side cover 324 and the upper cover 326 are connected to an upper elevation rod 337 through a support frame 327. When the upper elevation rod 337 is rotated by an elevation motor 338, the support frame 327 may be elevated. FIG. 10 is a view illustrating a state in which the side cover 324 and the upper cover 326 of FIG. 1 are removed. Referring to FIG. 10, the support fame 327 may be elevated to remove the side cover 324 and the upper cover 326 from the external reaction tube 312a ("a release position"). Thus, a worker may more easily replace the side heater 324a or maintain and repair the inside of the external reaction tube 312a and the inside of the lower chamber 312b.

The epitaxial apparatus further includes a gas supply unit. The gas supply unit includes a supply nozzle unit 332 and an exhaust nozzle unit 334. The supply nozzle unit 332 includes a plurality of supply tubes 332a and a plurality of supply nozzles 332b. The supply nozzles 332b are connected to the supply tubes 332a, respectively. Each of the supply nozzles 332b has a circular tube shape. A supply hole 332c is defined in a front end of each of the supply nozzles 332b. The reaction gas is discharged through the supply hole 332c. The supply hole 332c has a circular sectional area. As shown in FIG. 9, the supply holes 332c of the supply nozzles 332b may be defined at heights different from each other.

The supply tubes 332a and the supply nozzles 332b are disposed inside the external reaction tube 312a. The supply tubes 332a extend vertically. The supply nozzles 332b may be disposed substantially perpendicular to the supply tubes 332a. The supply holes 332c are defined inside the internal reaction tube 314. Thus, the reaction gas discharged through the supply holes 332c may be concentrated into the reaction region within the internal reaction tube 314. The internal reaction tube 314 has a plurality of through-holes 374. The supply holes 332c of the supply nozzles 332b may be defined inside the internal reaction tube 314 through the through-holes 374.

FIG. 11 is a cross-sectional view illustrating arrangements of the supply nozzles and thermocouples of FIG. 1. Referring to FIG. 11, the supply nozzles 332b have supply holes 332c, each having a circular sectional area, respectively. The supply holes 332c of the supply nozzles 332b are defined in a circumference direction along an inner wall of the internal reaction tube 314. Also, the supply holes 332c are defined at heights different from each other. When the substrate holder 328 is moved into the process position, the supply nozzles 332b spray the reaction gas onto each of the substrates S placed on the substrate holder 328. Here, the supply holes 332c are defined at heights substantially equal to those of the substrates S, respectively. As shown in FIG. 9, the supply nozzles 332b are connected to reaction gas sources (not shown) through the supply lines 342 disposed in the support flange 442, respectively.

A deposition gas (and a carrier gas) or an etching gas (and the carrier gas) may be supplied as the reaction gas sources. The deposition gas includes silane and halogenation silane. The silane includes higher silane having the following empirical formula: $Si_xH_{(2x+2)}$, such as silane ($SiH_4$), disilane ($Si_2H_6$), trisilane ($Si_3H_8$), and tetrasilane ($Si_4H_{10}$). The halogenation silane includes a compound having the following empirical formula: $X'_ySi_xH_{(2x+2-y)}$, such as hexachlorosilane ($Si_2Cl_6$), tetrachlorosilane ($SiCl_4$), dichlorosilane ($Cl_2SiH_2$), and trichlorosilane ($Cl_3SiH$). The etching gas may include chlorine ($Cl_2$), hydrogen chloride (HCl), boron trichloride ($BCl_3$), boron tetrachloride ($CCl_4$), chlorine trifluoride ($ClF_3$), and a combination thereof. At the empirical formula $X'_ySi_xH_{(2x+2-y)}$, X' is F, Cl, Br or I. The carrier gas includes hydrogen $H_2$, nitrogen $N_2$, argon, helium, and a combination thereof. A selective epitaxy process involves deposition reaction and etching reaction. Although not shown in the current embodiment, when an epitaxy layer is required to include a dopant, a dopant-containing gas (e.g., arsine ($AsH_3$), phosphine ($PH_3$), and/or diborane ($B_2H_6$)) may be supplied.

As shown in FIG. 9, the exhaust nozzle unit 334 includes a plurality of exhaust tubes 334a and a plurality of exhaust nozzles 334b. The exhaust nozzles 334b are connected to the exhaust tubes 334a, respectively. An exhaust hole 334c is defined in a front end of each of the exhaust nozzles 334b to suction non-reaction gases and byproducts. The exhaust hole 334c has a sectional area having a slot shape. As shown in FIG. 9, the exhaust nozzles 334b may be disposed at heights different from those of the exhaust holes 334c.

The exhaust tubes 334a and the exhaust nozzles 334b are disposed inside the external reaction tube 312a. The exhaust tubes 334a extend vertically. The exhaust nozzles 334b may be disposed substantially perpendicular to the exhaust tubes 334a. The exhaust holes 334c are defined inside the internal reaction tube 314. Thus, the non-reaction gases and byproducts may be effectively suctioned from the reaction region within the internal reaction tube 314 through the exhaust holes 334c. The internal reaction tube 314 has a plurality of through-holes 376. The exhaust holes 334c of the exhaust nozzles 334b may be defined inside the internal reaction tube 314 through the through-holes 376.

Figure 12:
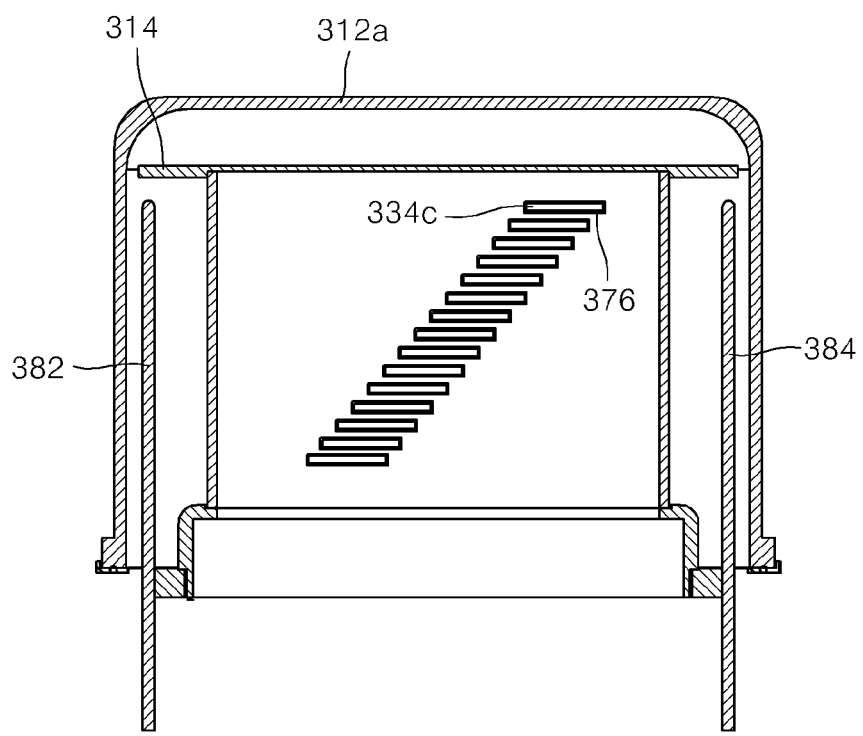
FIG. 12 is a cross-sectional view illustrating arrangements of the exhaust nozzles and the thermocouples of FIG. 1.

FIG. 12 is a cross-sectional view illustrating arrangements of the exhaust nozzles and the thermocouples of FIG. 1. Referring to FIG. 12, the exhaust nozzles 334b have exhaust holes 334c, each having a slot-shaped sectional area, respectively. The exhaust holes 334c of the exhaust nozzles 334b are defined in a circumference direction along the inner wall of the internal reaction tube 314. Also, the exhaust holes 334c are defined at heights different from each other. The substrate holder 328 is moved into the process position, the supply nozzles 332b spray the reaction gas onto each of the substrates S placed on the substrate holder 328. Here, the non-reaction gas and byproducts may be generated within the internal reaction tube 314. The exhaust nozzles 334b suction the non-reaction gases and the byproducts to discharge the non-reaction gases and the byproducts to the outside. The exhaust holes 334c are defined at heights substantially equal to those of the substrates S, respectively. As shown in FIG. 4, the exhaust nozzles 334b are connected to the first exhaust line 342 through the exhaust port 344 disposed in the lower chamber 312b to discharge the non-reaction gases and the byproducts through the first exhaust line 342. A switching valve 346 is disposed on the first exhaust line 342 to open or close the first exhaust line 342. A turbo pump 348 is disposed on the first exhaust line 342 to forcibly discharge the non-reaction gases and the byproducts through the first exhaust line 342. The first exhaust line 342 is connected to the second exhaust line 352 to discharge the non-reaction gases and the byproducts, which are moved along the first exhaust line 342, through the second exhaust line 352.

The auxiliary exhaust port 328a is disposed in the lower chamber 312b. The auxiliary exhaust line 328b is connected to the auxiliary exhaust port 328a. The auxiliary exhaust line 328b is connected to the second exhaust line 352. First and second auxiliary valves 328c and 328d are disposed on the auxiliary exhaust line 328b to open or close the auxiliary exhaust line 328b. The auxiliary exhaust line 328b is connected to the first exhaust line 342 through a connection line 343. A connection valve 343a is disposed on the connection line 343 to open or close the connection line 343.

As shown in FIGS. 11 and 12, thermocouples 382 and 384 are disposed between the external reaction tube 312a and the internal reaction tube 314. The thermocouples 382 and 384 are vertically disposed to measure temperatures according to heights. Thus, a worker may grasp temperatures within the process space according to the heights. As a result, effects of temperature distribution on the process may be previously checked.

Figure 13:
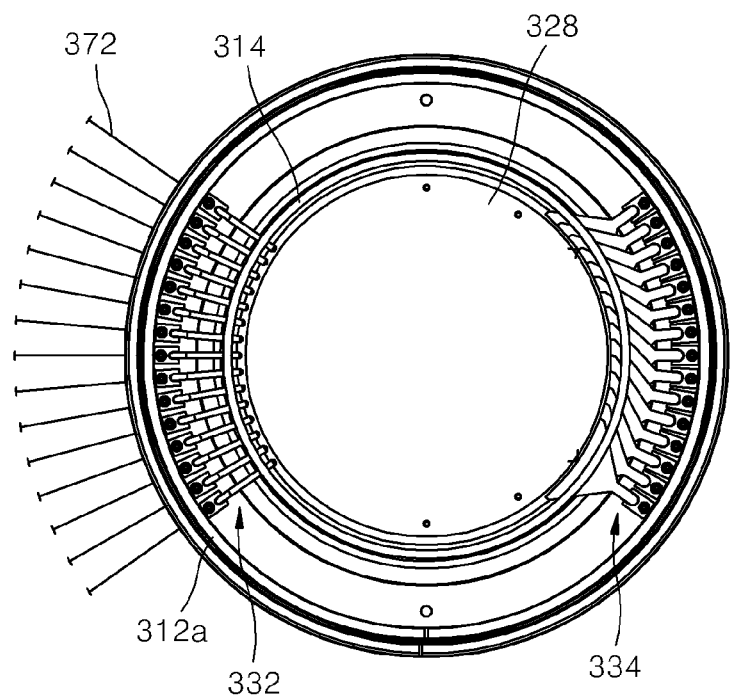
FIG. 13 is a view of supply lines respectively connected to the supply nozzles of FIG. 1.

FIG. 13 is a view of supply lines respectively connected to the supply nozzles of FIG. 1. As shown in FIG. 13, the supply nozzles 332 are connected to the reaction gas sources (not shown) through the separate supply lines 342. Thus, the reaction gas may be uniformly supplied into the reaction region of the internal reaction tube 314 through the plurality of supply nozzles 332. If one supply line 342 is connected to a plurality of supply nozzles 332, the reaction gas may be supplied with different flow rates according to the supply nozzles 332. Thus, a process rate may vary according to the positions of the substrate holder 328.

Figure 14:
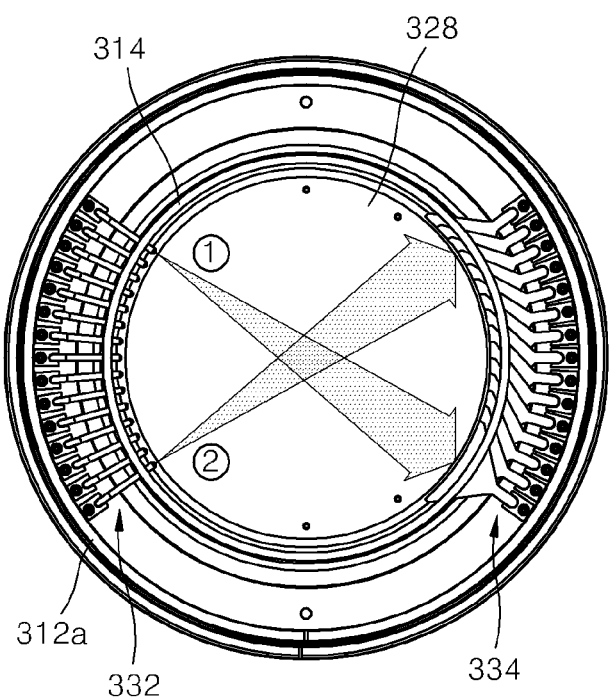
FIG. 14 is a view illustrating a flow of a reaction gas within the internal reaction tube of FIG. 1.

FIG. 14 is a view illustrating a flow of the reaction gas within the internal reaction tube of FIG. 1. As described above, the supply holes 332c of the supply nozzles 332b are defined in the circumference direction along the inner wall of the internal reaction tube 314. Also, the supply holes 332c are defined at height different from each other. Also, the exhaust holes 334c of the exhaust nozzles 334b are defined in the circumference direction along the inner wall of the internal reaction tube 314. Also, the exhaust holes 334c are defined at heights different from each other. Here, a center of each of the supply holes 332c is symmetric to that of each of the exhaust holes 334c with respect to the same height. That is, the supply hole 332c of the supply nozzle 332b and the exhaust hole 334c of the exhaust nozzle 334b are disposed opposite to each other with respect to a center of the substrate S stacked on the substrate holder 328. Thus, the reaction gas sprayed from the supply nozzle 332b flows toward the exhaust nozzle 334b disposed opposite to the supply nozzle 332b (indicated as an arrow). Thus, it may secure a sufficient time for which the reaction gas and the substrate S react with each other. Here, the non-reaction gases and the byproducts generated during the process are suctioned and discharged through the exhaust nozzle 334b.

As shown in FIG. 14, a flow of the reaction gas may vary according to a height of the substrates S stacked on the substrate holder 328. Thus, the flow of the reaction gas has a phase difference according to a height of the substrate S. That is, since a position of the supply hole 332c of the supply nozzle 332b and a position of the exhaust hole 334c of the exhaust nozzle 334b have a phase difference according to the height of the substrate S, similarly, the reaction gas has a phase difference according to the height of the substrate S. Referring to FIG. 13, a reference numeral ① denotes a flow of a reaction gas flowing from the supply nozzle 332b, which is located in the uppermost, toward the exhaust nozzle 334b, and a reference numeral ② denotes a flow of a reaction gas flowing from the supply nozzle 332b, which is located at the bottom, toward the exhaust nozzle 334b. The reference numerals ① and ② have a phase difference of a predetermined angle. Thus, the reaction gas sprayed from the supply hole may be diffused by the reaction gas sprayed from the supply hole defined at a different height. That is, the flows of the reaction gas having the phase difference may interfere with each other. Thus, the reaction gas may be moved toward the exhaust nozzle 334b in a state where the reaction gas is diffused by the interference.

Also, the supply hole 332c of the supply nozzle 332b has a circular shape. On the other hand, the exhaust hole 334c of the exhaust nozzle 334b has a slot shape. Thus, the reaction gas sprayed from the supply hole 332c of the supply nozzle 332b may be diffused to have a predetermined width according to a shape of the exhaust hole 334c (see FIG. 14). Therefore, an area on which the reaction gas contacts a surface of the substrate S may be increased. Also, the sufficient reaction may be induced to restrict the generation of the non-reaction gases. The reaction gas forms a laminar-flow on the substrate S from the supply hole 332c up to the exhaust hole 334c.

The epitaxial process may start by adjusting the process space (or the reaction region) including the substrate S to a preset temperature and pressure. In general, the process space should be maintained at a uniform temperature during the epitaxial process. However, a temperature within the process space may be variable during the epitaxial process. The process space may be maintained by the side heater 324a at a temperature of about 250° C. to about 1000° C., preferably, a temperature of about 500° C. to about 800° C., more preferably, a temperature of about 550° C. to about 750° C. A process temperature suitable for performing the epitaxial process may be affected by the reaction gas used for deposition and/or etching.

As described above, the epitaxy layer is formed by the chemical vapor deposition. A substrate S may be exposed to the reaction gas (the deposition gas) under the process temperature. The reaction gas may be activated under the process temperature to form the epitaxy layer on the substrate S. In the deposition process, a polycrystalline layer is formed on an amorphous and/or polycrystalline surface of the substrate S to form an epitaxial layer on a monocrystalline surface of the substrate S. Also, as the substrate S is exposed to the reaction gas (etching gas), a surface of the substrate S may be etched. In the etching process, only an edge of the epitaxial layer may remain to minimize or completely remove the polycrystalline layer.

As shown in FIG. 4, the substrate holder 328 is connected to the rotation shaft 318. The rotation shaft 318 passes through the lower chamber 312b and is connected to an elevation motor 319a and a rotation motor 319b. A motor housing 319c is disposed on the rotation motor 319b. The rotation motor 319b drives the rotation shaft 318 while the epitaxial process is performed to rotate the substrate holder 328 (and a substrates S) together with the rotation shaft 318. This is done because the reaction gas flows from the supply hole 332c toward the exhaust hole 334c, and the reaction gas is reduced in concentration as the reaction gas is deposited on the substrate S from the supply hole 332c toward the exhaust hole 334c. To prevent the above-described phenomenon from occurring, the substrate S may be rotated so that the reaction gas is uniformly deposited on a surface of the substrate S.

Figure 15:
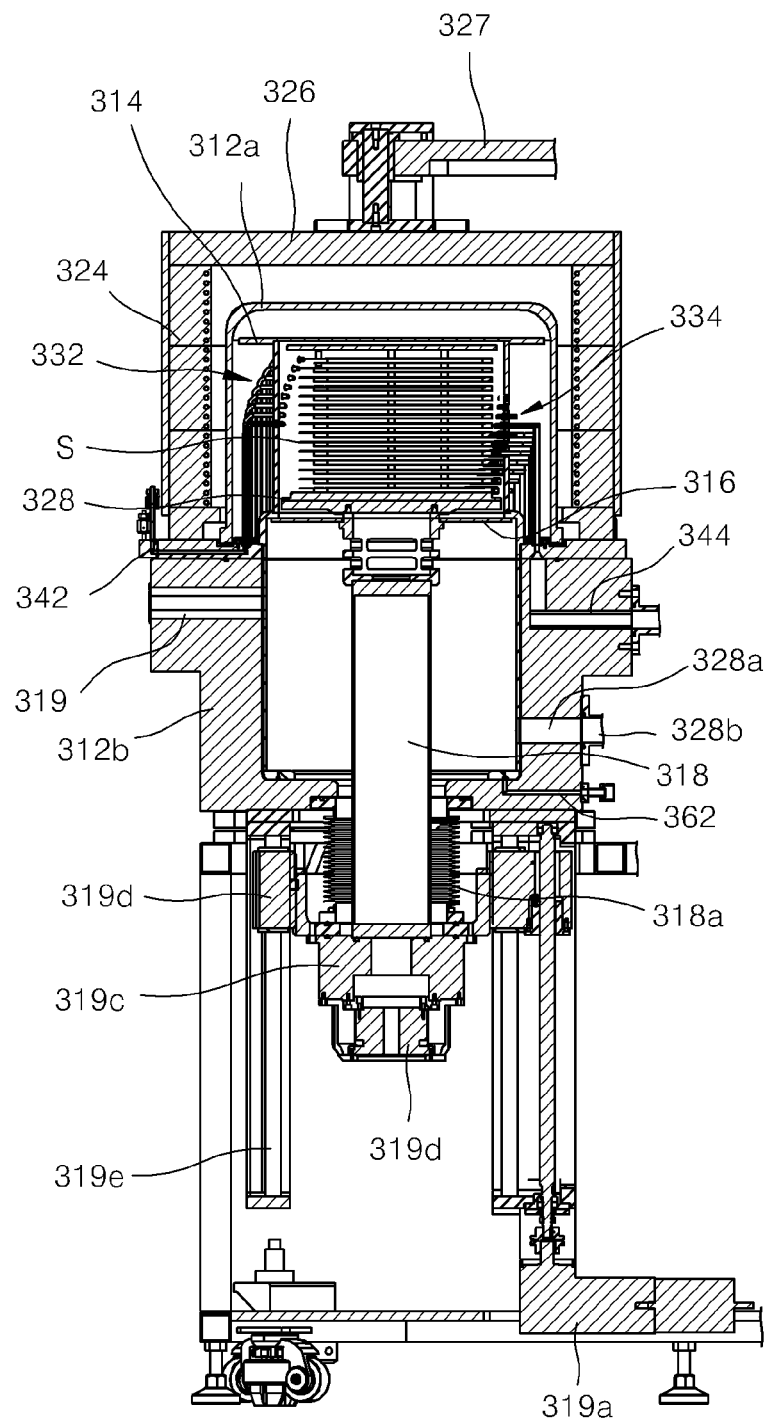
FIGS. 15 and 16 are views illustrating a state in which the substrate holder of FIG. 1 is moved to a process position.
Figure 16:
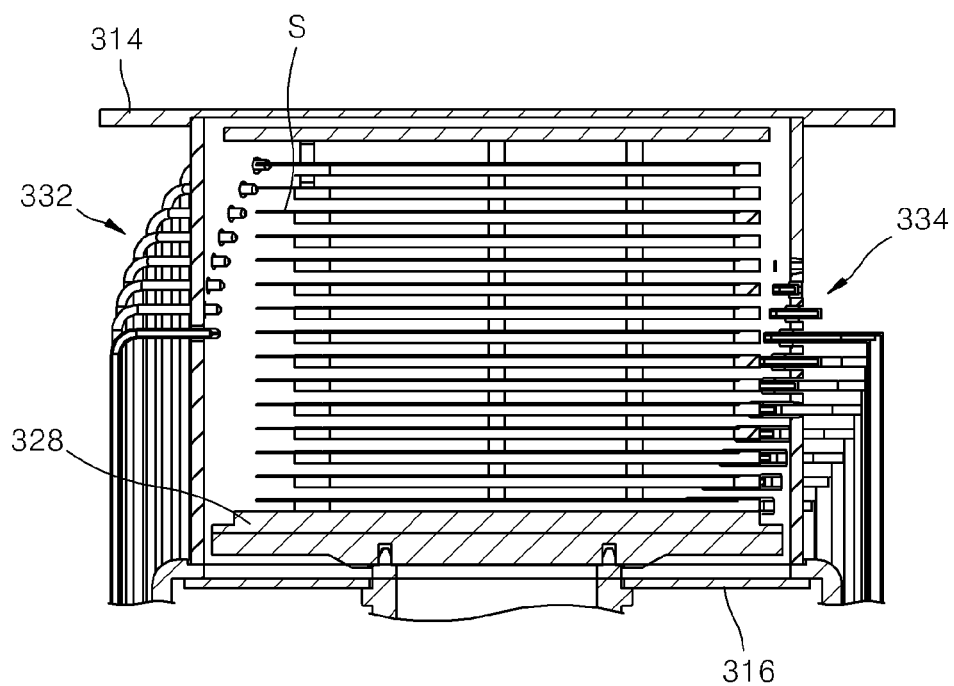

The motor housing 319c is fixed to a bracket 319d. The bracket 319d is connected to a lower guide connected to a lower portion of the lower chamber 312b and elevated along the elevation rod 319e. The bracket 319d is screw-coupled to a lower rod 419, and the lower rod 419 is rotated by the elevation motor 319a. That is, the lower rod 419 is rotated as the elevation motor 319a is rotated. Thus, the bracket 319d and the motor housing 319c may be elevated together. Therefore, the rotation shaft 318 and the substrate holder 328 may be elevated together. The substrate holder 328 may be moved from the stacking position into the process position by the elevation motor 319a. A bellows 318a connects the lower chamber 312b to the motor housing 319c. Thus, the inside of the lower chamber 312b may be sealed. FIGS. 15 and 16 are views illustrating a state in which the substrate holder of FIG. 1 is moved to a process position;

Referring to FIG. 15 and FIG. 16, the heat blocking plate 316 is disposed under the substrate holder 328. As the rotation shaft 318 is elevated, the substrate holder 328 is elevated together with the rotation shaft 318. The heat blocking plate 316 closes the opened lower side of the internal reaction tube 314 to prevent heat within the internal reaction tube 314 from being transmitted into the stacking space within the lower chamber 312b.

Figure 17:
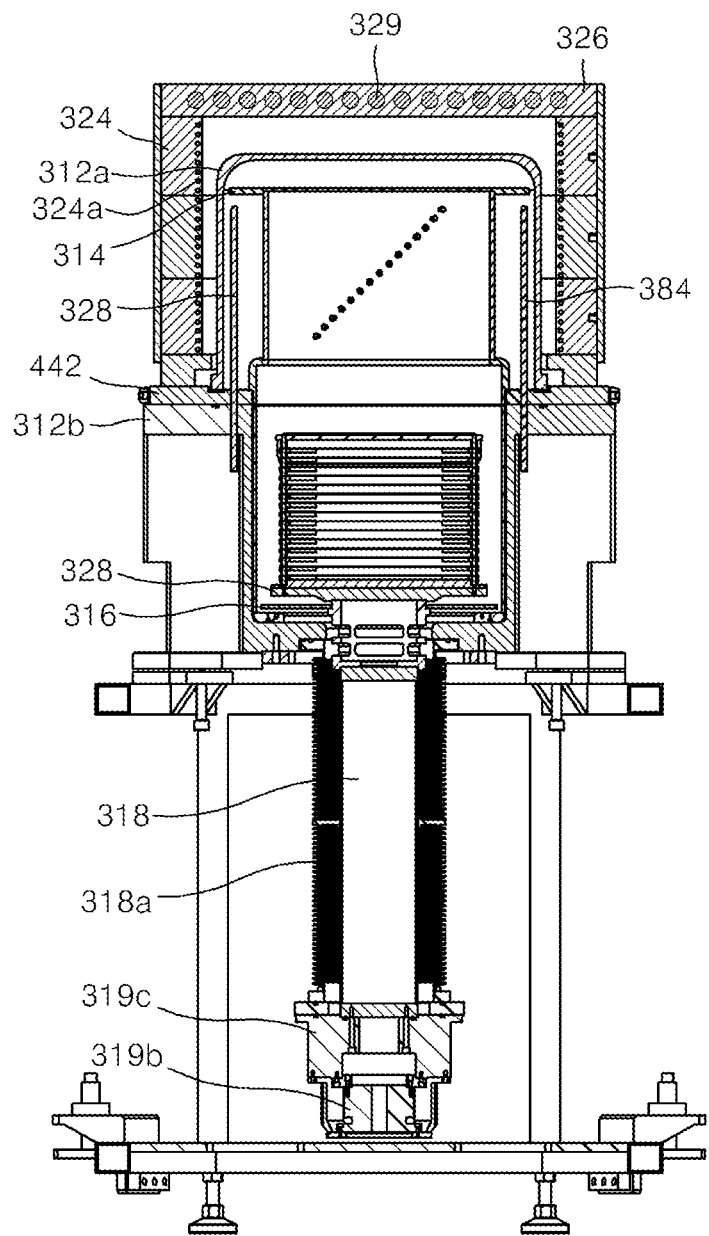
FIG. 17 is a schematic view of an epitaxial apparatus according to another embodiment of the present invention.

FIG. 17 is a schematic view of an epitaxial apparatus according to another embodiment of the present invention. Hereinafter, only configurations different from those according to the foregoing embodiment will be described. Thus, omitted descriptions herein may be substituted for the above-described contents.

An epitaxial apparatus further includes an upper antenna 329. The upper antenna 329 is disposed within the upper cover 326. The upper antenna 329 is connected to an RF power source (not shown) to generate radicals within a reaction region in an ICP manner. The upper antenna 329 together with a side heater 324a may perform a cleaning process. The epitaxial apparatus may perform a cleaning process together with an epitaxial process on a substrate S in an in-situ manner. In this case, the cleaning process and the epitaxial process may be successively performed on the substrate S within an internal reaction tube 314. While the substrate S is transferred, the substrate S is not exposed to the atmosphere to prevent the substrate S from being exposed by contaminants (e.g., O2, particle materials, and the like).

A reaction gas source includes a gas container (not shown) in which a radical generation gas (e.g., $H_2$ or $NH_3$) is filled and a gas container (now shown) in which a carrier gas ($N_2$) is filled. A radical generation gas and a carrier gas are supplied into the reaction region of the internal reaction tube 314 through supply nozzles 332. Here, the upper antenna 329 generates an electric field within the reaction region through the ICP manner. The radical gas may be plasmarized to generate radicals.

Also, the reaction gas source includes a container in which a reaction gas (e.g., a fluoride gas such as $NF_3$) is filled. The reaction gas may be supplied into the reaction gas of the internal reaction tube 314 through the supply nozzles 332. Thus, the radicals (for example, hydrogen radicals) are mixed with the reaction gas to react with the reaction gas. In this case, a reaction formula may be expressed as follows.

$$H^* + NF_3 \Rightarrow NH_xF_y(NH_4FH, NH_4FHF, etc)$$

$$NH_xF_y + SiO_2 \Rightarrow (NH_4F)SiF_6 + H_2O\uparrow$$

That is, the reaction gas previously absorbed onto the surface of the substrate S and the radicals react with each other to generate an intermediate product ($NH_xF_y$). Then, the intermediate product ($NH_xF_y$) and native oxide ($SiO_2$) formed on the surface of the substrate S react with each other to generate a reaction product (($NH_4F$)$SiF_6$). The substrate S is placed on a substrate holder 328. The substrate holder 328 rotates the substrate S during the reaction process to assist the reaction so that the reaction uniformly occurs.

Exhaust nozzles 334b are connected to a first exhaust line 342 through an exhaust port 344 disposed in a lower chamber 312b to suction the radicals and non-reaction gases within the reaction region, a non-reaction radical generation gas, byproducts generated when plasmarized, and a carrier gas through the exhaust nozzles 334b, thereby discharging them through the first exhaust line 342.

When the above-described reaction process is completed, a side heater 324a heats the substrate S at a predetermined temperature (i.e., a temperature of about 100° C. or more, for example, a temperature of about 130° C.). Thus, the reaction products may be pyrolyzed to generate a pyrolysis gas such as HF or $SiF_4$ which gets out of the surface of the substrate S. Then, the pyrolysis gas may be vacuum-exhausted to remove a thin film formed of silicon oxide from a surface of the substrate S.

$$(NH_4F)_6SiF_6 \Rightarrow NH_3\uparrow + HF\uparrow + SiF_4\uparrow$$

Similarly, byproducts (e.g., $NH_3$, HF, and $SiF_4$) within the reaction region are suctioned by the exhaust nozzles 334b and then discharged through the first exhaust line 342.

Figure 18:
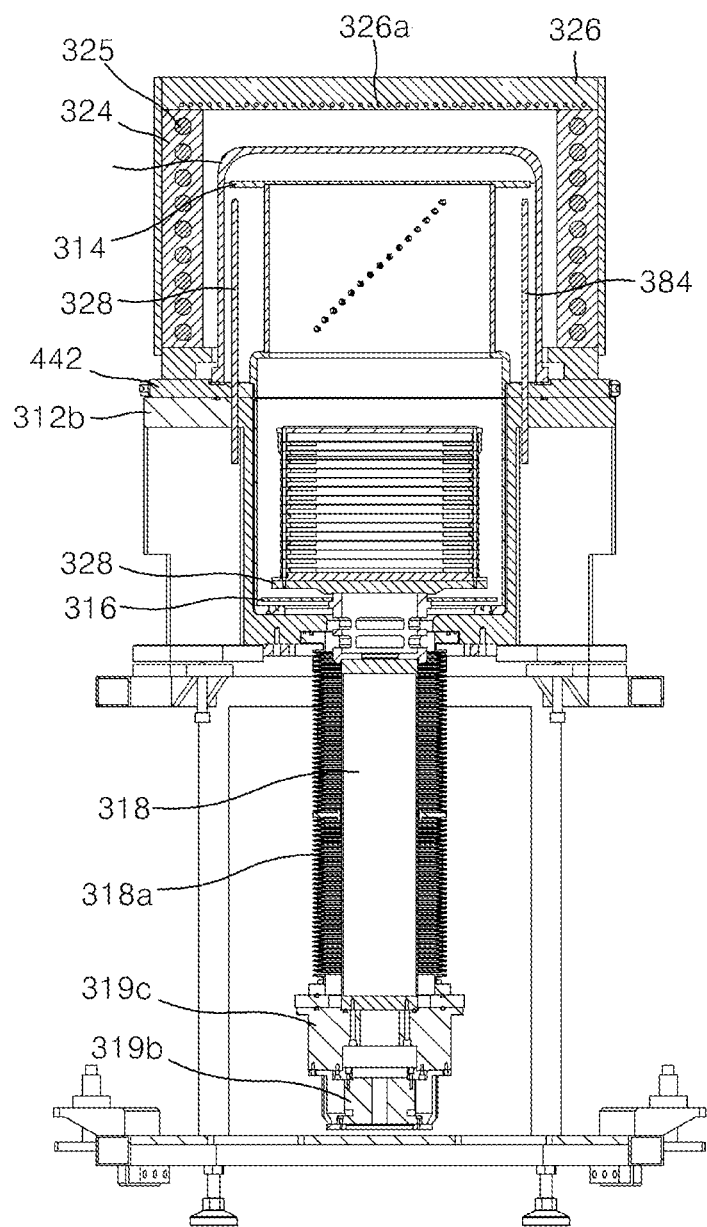
FIG. 18 is a schematic view of an epitaxial apparatus according to another embodiment of the present invention.

FIG. 18 is a schematic view of an epitaxial apparatus according to another embodiment of the present invention. Hereinafter, only configurations different from those according to the foregoing embodiment will be described. Thus, omitted descriptions herein may be substituted for the above-described contents.

Referring to FIG. 18, an upper heater 326a may be disposed within an upper cover 326. The upper heater 326a heats a process space within an external reaction tube 312a. Thus, the process space (or a reaction region) may reach a temperature (a process temperature) enough to perform an epitaxial process. The process space may be maintained by the upper heater 326a at a temperature of about 250° C. to about 1000° C., preferably, a temperature of about 500° C. to about 800° C., more preferably, a temperature of about 550° C. to about 750° C. Also, as shown in FIG. 18, a side antenna 325 may be disposed within a side cover 324. The side antenna 325 may be connected to an RF power source (not shown) to generate radicals within the reaction region in an ICP manner. The side antenna 325 together with the upper heater 326a may perform a cleaning process. The epitaxial apparatus may perform the cleaning process together with the epitaxial process on the substrate S in an in-situ manner. In this case, the cleaning process and the epitaxial process may be successively performed on the substrate S within an internal reaction tube 314. While the substrate S is transferred, the substrate S is not exposed to the atmosphere to prevent the substrate S from being exposed by contaminants (e.g., O2, particle materials, and the like).

Figure 19:
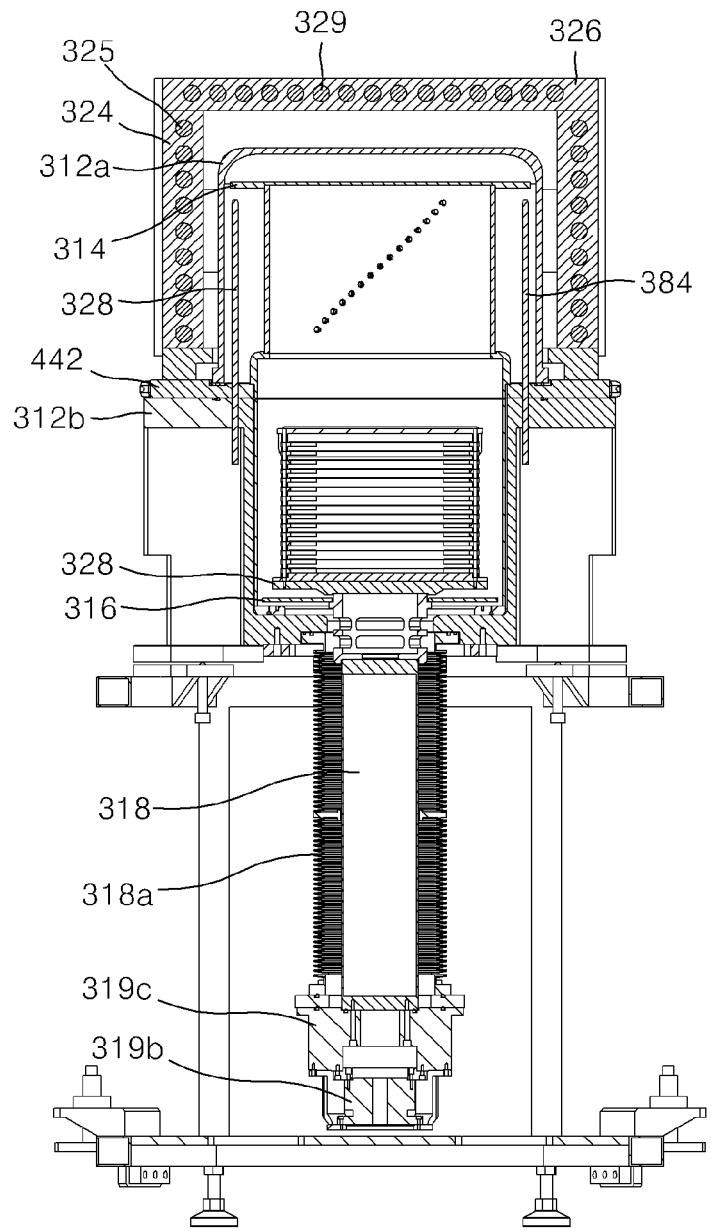
FIG. 19 is a schematic view of an epitaxial apparatus according to another embodiment of the present invention.

FIG. 19 is a schematic view of an epitaxial apparatus according to another embodiment of the present invention. Hereinafter, only configurations different from those according to the foregoing embodiment will be described. Thus, omitted descriptions herein may be substituted for the above-described contents.

Referring to FIG. 19, a side antenna 325 may be disposed within a side cover 324. An upper antenna 325 may be disposed within an upper cover 326. The side antenna 325 and the upper antenna 329 are connected to an RF power source (not shown). Also, the side antenna 325 and the upper antenna 329 may perform a cleaning process together with an epitaxial process on a substrate S in an in-situ manner. In this case, the cleaning process and the epitaxial process may be successively performed on the substrate S within an internal reaction tube 314. While the substrate S is transferred, the substrate S is not exposed to the atmosphere to prevent the substrate S from being exposed by contaminants (e.g., $O_2$, particle materials, and the like).

The side antenna 325 and the upper antenna 329 generate an electric field within a reaction region through an ICP manner to generate radicals from a radical generation gas. The radicals (e.g., hydrogen radicals) are mixed with a reaction gas to react with the reaction gas. That is, the reaction gas previously absorbed onto a surface of the substrate S and the radicals react with each other to generate an intermediate product ($NH_xF_y$). Then, the intermediate product ($NH_xF_y$) and native oxide ($SiO_2$) formed on the surface of the substrate S react with each other to generate a reaction product (($NH_4F$)$SiF_6$).

The substrate S may be heated using reaction heat generated during the above-described reaction process at a predetermined temperature (i.e., a temperature of about 100° C. or more, for example, a temperature of about 130° C.). Thus, the reaction products may be pyrolyzed to generate a pyrolysis gas such as HF or $SiF_4$ which gets out of the surface of the substrate S. Then, the pyrolysis gas may be vacuum-exhausted to remove a thin film formed of silicon oxide from the surface of the substrate S.

Unlike the forgoing embodiments, an epitaxial layer may be formed using plasma through a chemical vapor deposition process. Also, a heating process with respect to the process space may be omitted. In a state where the substrate S is exposed to the reaction gas (a deposition gas), the side antenna 325 and the upper antenna 329 may generate an electric field to activate the reaction gas. As a result, the epitaxial layer may be formed on the substrate S. Also, in the state where the substrate S is exposed to the reaction gas (an etching gas), the side antenna 325 and the upper antenna 329 may generate an electric field to activate the reaction gas. As a result, the surface of the substrate S may be etched.

Figure 20:
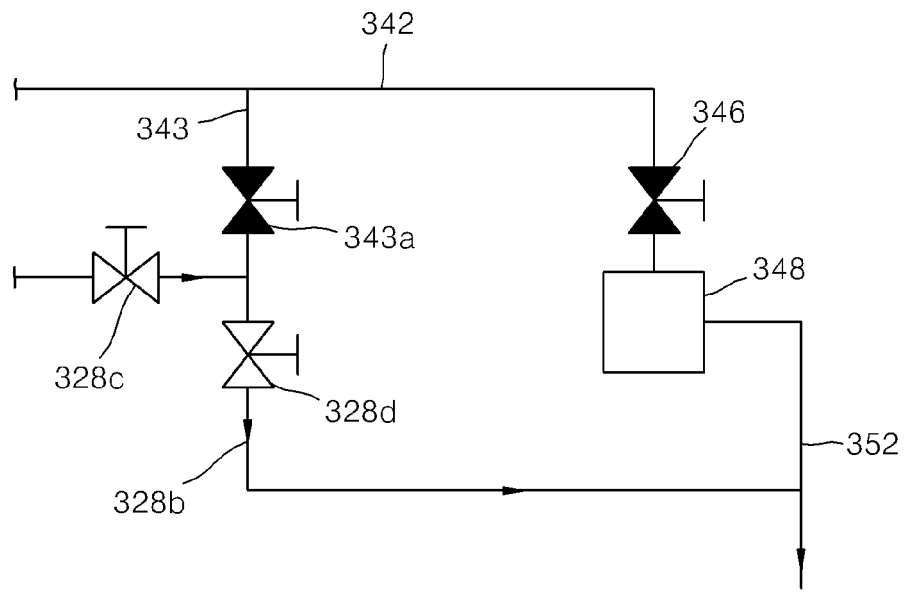
FIGS. 20 to 22 are views illustrating an exhaust process using an exhaust port and an auxiliary exhaust port.
Figure 21:
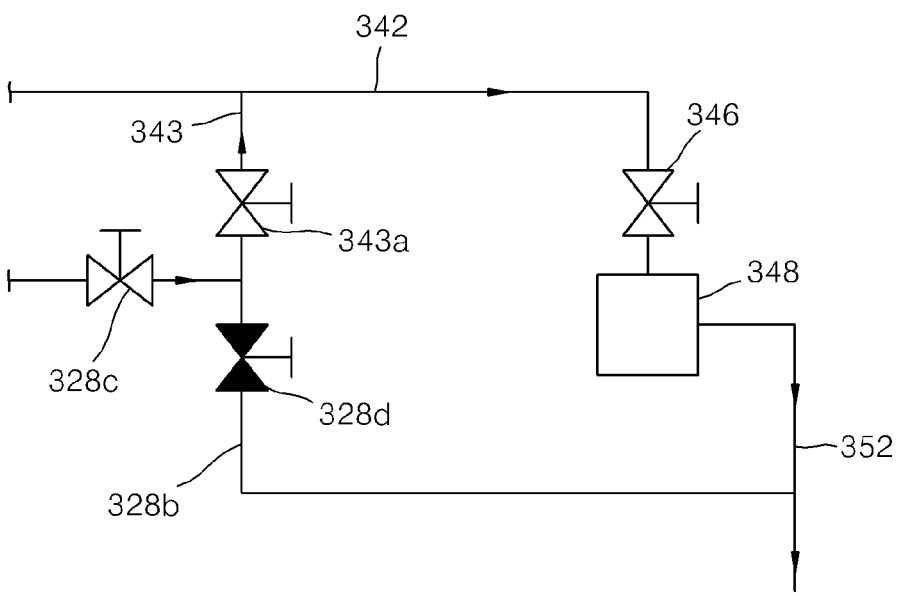
Figure 22:
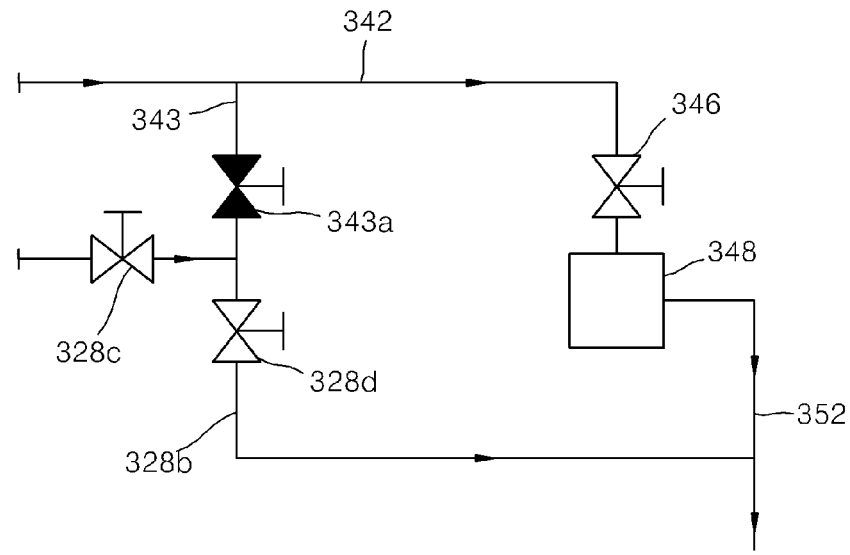

FIGS. 20 to 22 are views illustrating an exhaust process using an exhaust port and an auxiliary exhaust port. As shown in FIG. 4, the exhaust nozzles 334b are connected to the first exhaust line 342 through the exhaust port 344 disposed in the lower chamber 312b to discharge the non-reaction gases and the byproducts through the first exhaust line 342. The switching valve 346 is disposed on the first exhaust line 342 to open or close the first exhaust line 342. The turbo pump 348 is disposed on the first exhaust line 342 to forcibly discharge the non-reaction gases and the byproducts through the first exhaust line 342. The first exhaust line 342 is connected to the second exhaust line 352 to discharge the non-reaction gases and the byproducts, which are moved along the first exhaust line 342, through the second exhaust line 352.

The auxiliary exhaust port 328a is disposed in the lower chamber 312b. The auxiliary exhaust line 328b is connected to the auxiliary exhaust port 328a. The auxiliary exhaust line 328b is connected to the second exhaust line 352. First and second auxiliary valves 328c and 328d are disposed on the auxiliary exhaust line 328b to open or close the auxiliary exhaust line 328b. The auxiliary exhaust line 328b is connected to the first exhaust line 342 through the connection line 343. The connection valve 343a is disposed on the connection line 343 to open or close the connection line 343.

The auxiliary exhaust port 328a will be described in more detail below. First, before a process is performed, the inside of the lower chamber 312b and the inside of the external reaction tube 312a (or the internal reaction tube 314) should be in vacuum state. Here, the worker may form the inner vacuum states of the lower chamber 312b and the external reaction tube 312a (or the internal reaction tube 314) using the auxiliary exhaust port 328a. The worker may close the connection valve 343a and the switching valve 346 in a state where the first and second auxiliary valves 328c and 328b are opened. In this case, the gases may be exhausted through the auxiliary exhaust line 328b and the second exhaust line 352 (see FIG. 20).

Next, when the gases and the byproducts are exhausted through the auxiliary exhaust line 328b and the second exhaust line 352 for a predetermined time, the worker may close the second auxiliary valve 328d in a state where the first auxiliary valve 328c, the connection valve 343a, and the switching valve 346 are opened. In this case, the exhaust process may be performed through the auxiliary exhaust line 328b, the connection line 343, the first exhaust line 342, and the second exhaust line 352. Here, the exhaust process may be performed through the turbo pump 348. The turbo pump 348 may change an inner pressure of each of the lower chamber 312b and the external reaction tube 312a (or the internal reaction tube 314) into a process pressure using the turbo pump 348 (see FIG. 21).

When the insides of the lower chamber 312b and the external reaction tube 312a (or the internal reaction tube 314) become in the vacuum state through above-described two stages, it may prevent an excessive pressure from being applied to the lower chamber 312b and the external reaction tube 312a (or the internal reaction tube 314) due to the high-performance turbo pump 348. Also, in a case where the vacuum is formed using the auxiliary exhaust port 328a directly connected to the lower chamber 312b, the vacuum may be effectively formed when compared to a case in which the vacuum is formed using the exhaust port 344 connected to the exhaust nozzles 334b.

During the process, the worker may close the connection valve 343a in a state where the first and second auxiliary valves 328c and 328d and the switching valve 346 are opened. In this case, the non-reaction gases and the byproducts suctioned through the exhaust nozzles 334 may be discharged through the first and second exhaust lines 342 and 352. Also, the inert gas may be supplied into the stacking space of the lower chamber 312b through the auxiliary gas supply port 362. In addition, the inert gas within the stacking space of the lower chamber 312b may be discharged to the outside through the auxiliary exhaust line 328b. Thus, the stacking space may be set to a pressure slightly greater than that of the process space. Also, it may prevent the reaction gas within the process space from being moved into the stacking space (see FIG. 22).

Figure 23:
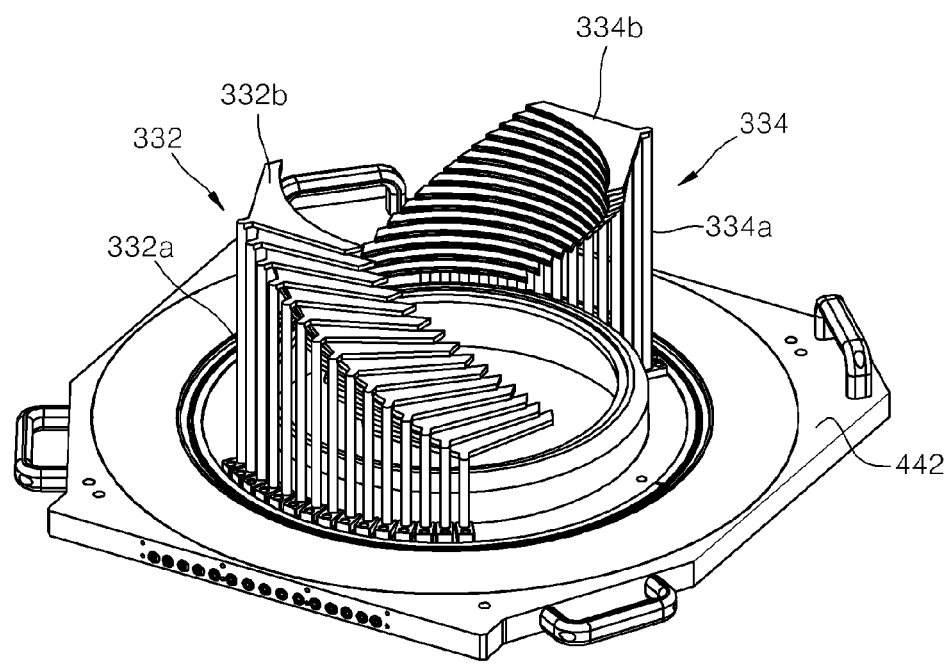
FIG. 23 is a schematic perspective view illustrating a modified example of the supply nozzles of FIG. 6.
Figure 24:
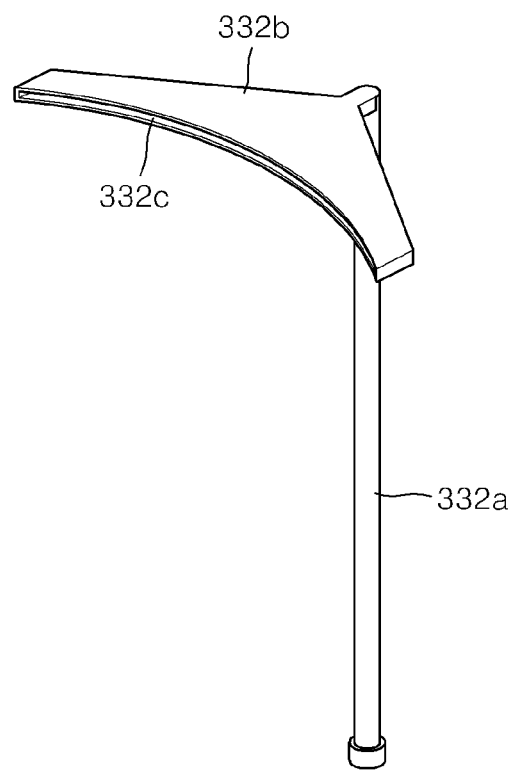
FIG. 24 is a perspective view illustrating the supply nozzle of FIG. 23.
Figure 25:
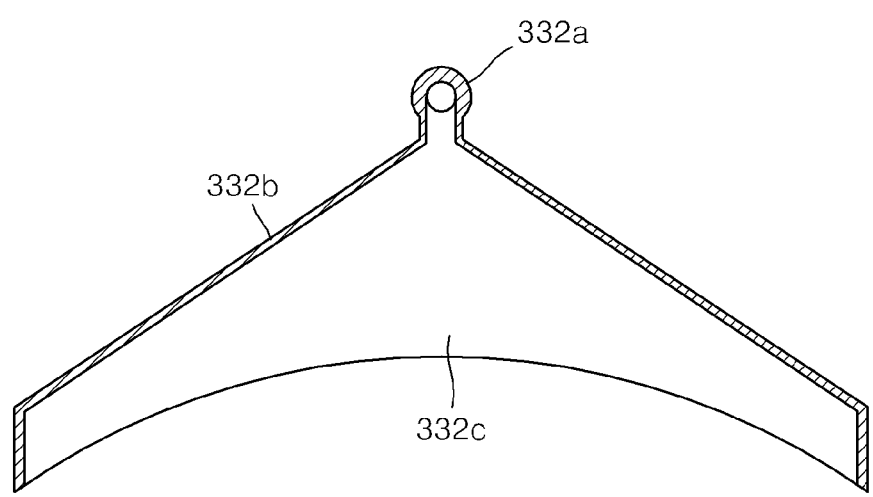
FIG. 25 is a cross-sectional view illustrating the supply nozzle of FIG. 23.

FIG. 23 is a schematic perspective view illustrating a modified example of the supply nozzles of FIG. 6. FIG. 24 is a perspective view illustrating the supply nozzle of FIG. 23. FIG. 25 is a cross-sectional view illustrating the supply nozzle of FIG. 23.

Referring to FIGS. 23 to 25, a supply nozzle 332b has an inner space with a sectional area gradually increasing in a discharge direction. A reaction gas supplied through a supply tube 332a is diffused along the inner space of the supply nozzle 332b. The supply nozzle 332b has a supply hole 332c defined in a front end thereof. The supply hole 332c has a sectional area with a slot shape. The supply hole 332c has a sectional area substantially equal to that of an exhaust hole 334c.

Figure 26:
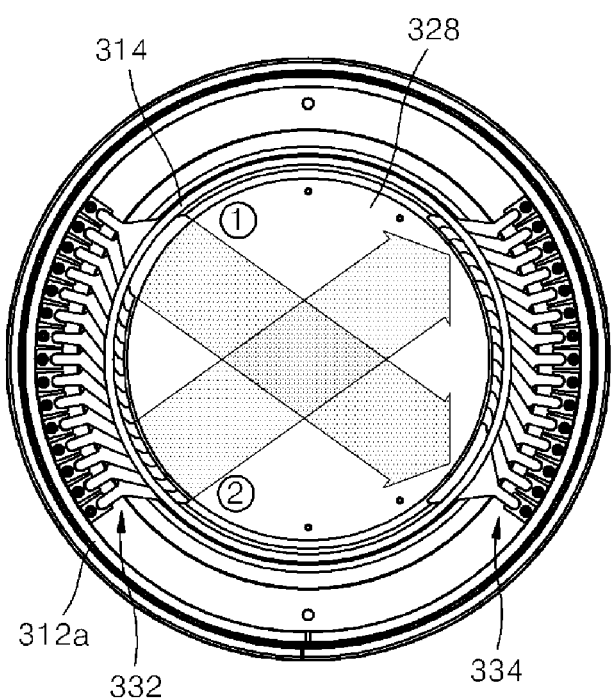
FIG. 26 is a view illustrating a flow of a reaction gas passing through the supply nozzles and the exhaust nozzles of FIG. 23.

FIG. 26 is a view illustrating a flow of a reaction gas passing through the supply nozzles and the exhaust nozzles of FIG. 23. Referring to FIG. 26, a reaction gas sprayed from the supply nozzle 332b flows toward an exhaust nozzle 334b disposed opposite to the supply nozzle 332b (indicated as an arrow). Here, since the reaction gas is discharged through the supply hole 332c in a state where the reaction gas is diffused through an inner space of the supply nozzle 332b and then is suctioned through an exhaust hole 334c of the exhaust nozzle 334b, the reaction gas forms a laminar flow having a constant width (the supply hole 332c has a sectional area substantially equal to that of the exhaust hole 334c) from the supply hole 332c up to the exhaust hole 334c.

Also, although not previously described, the exhaust nozzles 334b of FIGS. 6 and 23 may have the same structure as the supply nozzles 332b of FIGS. 23 to 25. That is, the exhaust nozzle 334b has an inner space with a sectional area gradually decreasing in a suction direction. Also, the non-reaction gas and the byproducts which are suctioned through the exhaust hole 334c converge along the inner space of the exhaust nozzle 334b and then are moved into the exhaust tube 334a.

Figure 27:
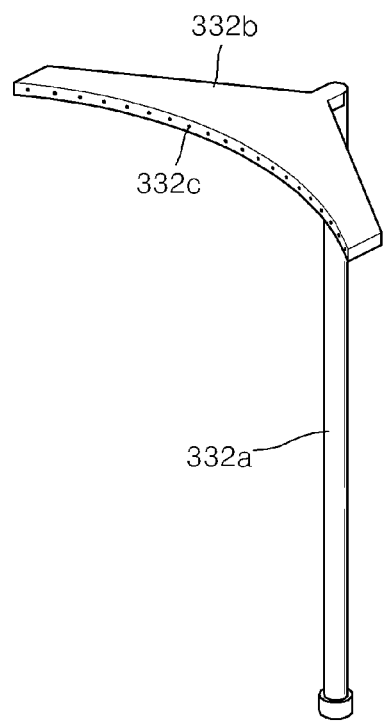
FIG. 27 is a schematic perspective view illustrating a modified example of the supply nozzle of FIG. 24.
Figure 28:
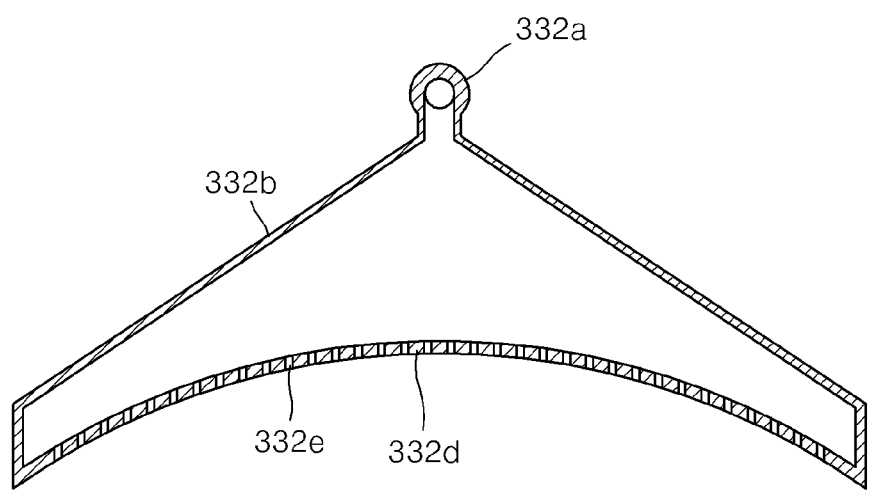
FIG. 28 is a cross-sectional view illustrating the supply nozzle of FIG. 27.

FIG. 27 is a schematic perspective view illustrating a modified example of the supply nozzle of FIG. 24. FIG. 28 is a cross-sectional view illustrating the supply nozzle of FIG. 27. Referring to FIGS. 27 and 28, a supply nozzle 332b includes a diffusion plate 332d. The diffusion plate 332d may be disposed on a supply hole 332c. The injection plate 332d has a plurality of injection holes 332e. A reaction gas diffused along an inner space of the supply nozzle 332b may be injected through the injection holes 332e.

According to the embodiment, the reaction gas may be activated to perform the process on the substrate.

Although the present invention is described in detail with reference to the exemplary embodiments, the invention may be embodied in many different forms. Thus, technical idea and scope of claims set forth below are not limited to the preferred embodiments.

What is claimed is:

1. A substrate processing apparatus in which a process with respect to substrates is performed, the substrate processing apparatus comprising:

a lower chamber having an opened upper portion, the lower chamber having a passage, through which the substrates are accessible, in a side thereof;

an external reaction tube closing the opened upper portion of the lower chamber to provide a process space in which the process is performed;

an internal reaction tube disposed within the external reaction tube;

a substrate holder on which the one or more substrates are vertically stacked, the substrate holder being movable between a stacking position at which the substrates are stacked within the substrate holder and a process position at which the process with respect to the substrates is performed;

a gas supply unit supplying a reaction gas into the process space; and a processing unit disposed outside the external reaction tube to activate the reaction gas, thereby performing the process with respect to the substrates,
wherein the gas supply unit comprises:
a plurality of supply nozzles disposed outside the internal reaction tube, each supply nozzle having an end tip portion inserted into the internal reaction tube through a respective one of first through-holes of the internal reaction tube, the end tip portion of each supply nozzle being configured to be open and forming a supply hole of each supply nozzle, the reaction gas being discharged through each of the supply holes, the supply holes being disposed in a circumference direction along an inner wall of the internal reaction tube to have a phase difference and being disposed at heights different from each other, the first through-holes of the internal reaction tube being disposed in the circumference direction along an inner wall of the internal reaction tube to have a phase difference and a height different from each other; and
a plurality of exhaust nozzles disposed outside the internal reaction tube, each exhaust nozzle having an end tip portion inserted into the internal reaction tube through a respective one of second through-holes of the internal reaction tube, the end tip portion of each exhaust nozzle being configured to be open and forming an exhaust hole of each exhaust nozzle, the exhaust nozzles, through the exhaust holes, suctioning non-reaction gases and byproducts within the process space, the exhaust holes being disposed in the circumference direction along the inner wall of the internal reaction tube to have a phase difference and being disposed at heights different from each other, the second through-holes of the internal reaction tube being disposed in the circumference direction along the inner wall of the internal reaction tube to have a phase difference and a height different from each other,
wherein a center of each of the supply holes is symmetric to a center of a corresponding one of the exhaust holes with respect to a center of the internal reaction tube, and each of the supply holes is disposed at a same height as the corresponding one of the exhaust holes, so that a flow of the reaction gas has a phase difference in a vertical direction.

2. The substrate processing apparatus of claim 1, wherein the processing unit comprises:
a heater disposed on one of a side portion and an upper portion of the external reaction tube, the heater heating the process space to perform an epitaxial deposition process on the substrates; and
a plasma generation member disposed on one of the side portion and the upper portion of the external reaction tube, the plasma generation member generating plasma to perform a cleaning process on the substrates.

3. The substrate processing apparatus of claim 2, wherein the plasma generation member comprises an ICP antenna.

4. The substrate processing apparatus of claim 1, wherein the processing unit comprises a heater disposed outside the external reaction tube, the heater heating the process space to perform an epitaxial deposition process on the substrates.

5. The substrate processing apparatus of claim 1, wherein the processing unit comprises a plasma generation member disposed outside the external reaction tube, the plasma generation member generating plasma to perform a cleaning process on the substrates.

6. The substrate processing apparatus of claim 1, wherein the internal reaction tube is disposed around the substrate holder at the process position to divide a reaction region with respect to the substrates.

7. The substrate processing apparatus of claim 6, further comprising a heat blocking plate disposed under the substrate holder to close an opened lower portion of the internal reaction tube when the substrate holder is disposed at the process position.

8. The substrate processing apparatus of claim 1, further comprising:
a cover in which the processing unit is mounted, the cover being disposed around the external reaction tube to surround the side and upper portions of the external reaction tube; and
a cover moving unit for moving the cover to the process position at which the cover surrounds the external reaction tube and a release position at which the cover is separated from the external reaction tube.

9. The substrate processing apparatus of claim 8, wherein the cover moving unit comprises:
an elevation rod disposed on a side of the cover in a state where the elevation rod stands up, the elevation rod having a screw thread on an outer surface thereof;
a support frame connected to the cover, the support frame being moved along the elevation rod through rotation of the elevation rod; and
a driving motor driving the elevation rod.

10. The substrate processing apparatus of claim 1, wherein the gas supply unit further comprises:
a plurality of supply tubes respectively connected to the plurality of supply nozzles to supply the reaction gas into each of the supply nozzles; and
a plurality of exhaust tubes respectively connected to the plurality of exhaust nozzles to allow the non-reaction gases and the byproducts suctioned through each of the exhaust nozzles to pass therethrough.

11. The substrate processing apparatus of claim 10, further comprising a rear exhaust line connected to the exhaust nozzles to discharge the non-reaction gases and the byproducts suctioned through the exhaust nozzles,
wherein the lower chamber comprises an exhaust port connecting the exhaust nozzles to the rear exhaust line and an auxiliary exhaust port connecting a stacking space defined within the lower chamber to the rear exhaust line.

12. The substrate processing apparatus of claim 11, wherein the stacking space has a pressure greater than that of the process space.

13. The substrate processing apparatus of claim 1, wherein the lower chamber comprises an auxiliary gas supply port connected to a stacking space defined within the lower chamber.

* * * * *